United States Patent
Rubinsztain et al.

(10) Patent No.: US 11,740,070 B1
(45) Date of Patent: Aug. 29, 2023

(54) ADAPTIVE ANGLE SENSOR

(71) Applicant: Allegro MicroSystems, LLC, Manchester, NH (US)

(72) Inventors: Ezequiel Rubinsztain, Buenos Aires (AR); Octavio H. Alpago, Cludad de Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/588,383

(22) Filed: Jan. 31, 2022

(51) Int. Cl.
*G01B 7/30* (2006.01)
*G01R 33/07* (2006.01)
*G01R 33/09* (2006.01)

(52) U.S. Cl.
CPC ............ *G01B 7/30* (2013.01); *G01R 33/072* (2013.01); *G01R 33/091* (2013.01); *G01R 33/093* (2013.01); *G01R 33/098* (2013.01)

(58) Field of Classification Search
CPC combination set(s) only.
See application file for complete search history.

(56) References Cited

U.S. PATENT DOCUMENTS

| | | |
|---|---|---|
| 10,884,092 B2 | 1/2021 | Rigoni et al. |
| 11,073,577 B2 | 7/2021 | Romero et al. |
| 2010/0181993 A1* | 7/2010 | Fernandez .............. G01B 7/30 324/207.2 |
| 2016/0069708 A1* | 3/2016 | Ausserlechner .......... G01P 3/38 324/207.23 |
| 2017/0199056 A1* | 7/2017 | Granig ................... G01D 5/145 |
| 2017/0356765 A1* | 12/2017 | Watanabe .............. G01D 5/145 |
| 2019/0195613 A1* | 6/2019 | Zimmer ............... G01R 33/093 |
| 2021/0372766 A1 | 12/2021 | Rigoni et al. |
| 2022/0357144 A1 | 11/2022 | Tombez |

* cited by examiner

*Primary Examiner* — Alvaro E Fortich
(74) *Attorney, Agent, or Firm* — Daly, Crowley, Mofford & Durkee, LLP

(57) ABSTRACT

A method comprising: obtaining at least three sampled values m, each of the sampled values m including a respective first component that is obtained based on a first signal and a respective second component that is obtained based on a second signal and solving a system of equations to yield at least one of (i) an offset adjustment vector k, (ii) a sensitivity mismatch coefficient γ, and (iii) a non-orthogonality coefficient s, the system of equations being arranged to model each of the sampled values m as a function of: a respective one of a plurality of number arrays, a magnetic field, and the at least one of (i) the offset adjustment vector k, (ii) the sensitivity mismatch coefficient γ, and (iii) the non-orthogonality coefficient s.

21 Claims, 9 Drawing Sheets

ADAPTIVE ANGLE SENSOR

BACKGROUND

As is known, sensors are used to perform various functions in a variety of applications. Some sensors include one or magnetic field sensing elements, such as a Hall effect element or a magnetoresistive element, to sense a magnetic field associated with proximity or motion of a target object, such as a ferromagnetic object in the form of a gear or ring magnet, or to sense a current, as examples. Sensor integrated circuits are widely used in automobile control systems and other safety-critical applications. There are a variety of specifications that set forth requirements related to permissible sensor quality levels, failure rates, and overall functional safety.

SUMMARY

According to aspects of the disclosure, a method is provided, comprising: obtaining at least three sampled values m, each of the sampled values m including a respective first component that is obtained based on a first signal and a respective second component that is obtained based on a second signal, the first signal being generated by first magnetic field sensing element in response to a magnetic field that is associated with a rotating target and the second signal being generated by a second magnetic field sensing element in response to the magnetic field that is associated with the rotating target, each of the at least three sampled values being associated with a different respective angular position of the rotating target; generating a plurality of number arrays based on the at least three sampled values m, each of the number arrays corresponding to a different respective sampled value m, each of the number arrays being based on a scaled or non-scaled value of the first component of the array's corresponding sampled value m and a scaled or non-scaled value of the second component of the array's corresponding sampled value m; solving a system of equations to yield at least one of (i) an offset adjustment vector k, (ii) a sensitivity mismatch coefficient γ, and (iii) a non-orthogonality coefficient s, the system of equations being arranged to model each of the sampled values m as a function of: the respective one of the plurality of number arrays that is generated based on the sampled value m, the magnetic field that is associated with the rotating target, and the at least one of (i) the offset adjustment vector k, (ii) the sensitivity mismatch coefficient γ, and (iii) the non-orthogonality coefficient s; and storing the at least one of (i) the offset adjustment vector k, (ii) the sensitivity mismatch coefficient γ, and (iii) the non-orthogonality coefficient s in a memory for use in adjusting at least one of the first signal and the second signal.

According to aspects of the disclosure, a sensor is provided, comprising: a first magnetic field sensing element, the first sensing element being arranged to generate a first signal in response to a magnetic field that is associated with a rotating target; a second magnetic field sensing element, the second sensing element being arranged to generate a second signal in response to the magnetic field that is associated with the rotating target; a memory; and a processing circuitry operatively coupled to the memory, the first magnetic field sensing element and the second magnetic field sensing element, the processing circuitry being configured to: obtain at least three sampled values m, each of the sampled values m including a respective first component that is obtained based on the first signal and a respective second component that is obtained based on the second signal, each of the at least three sample values being associated with a different angular position of the rotating target; generate a plurality of number arrays based on the at least three sampled values m, each of the number arrays corresponding to a different respective sampled value m, each of the number arrays being based on a scaled or non-scaled value of the first component of the array's corresponding sampled value m and a scaled or non-scaled value of the second component of the array's corresponding sampled value m; and solve a system of equations to yield an offset adjustment vector k, the system of equations being arranged to model each of the sampled values m as a function of: the respective one of the plurality of number arrays that is generated based on the sampled value m, the magnetic field that is associated with the rotating target, and the offset adjustment vector k; and store the offset adjustment vector k in the memory for use in adjusting at least one of the first signal and the second signal.

According to aspects of the disclosure, a system is provided, comprising: a processing circuitry configured to: obtain at least three sampled values m, each of the sampled values m including a respective first component that is obtained based on a first signal and a respective second component that is obtained based on a second signal, the first signal being generated by first magnetic field sensing element in response to a magnetic field that is associated with a rotating target and the second signal being generated by a second magnetic field sensing element in response to the magnetic field that is associated with the rotating target, each of the at least three sampled values being associated with a different respective angular position of the rotating target; generate a plurality of number arrays based on the at least three sampled values m, each of the number arrays corresponding to a different respective sampled value m, each of the number arrays being based on a scaled or non-scaled value of the first component of the array's corresponding sampled value m and a scaled or non-scaled value of the second component of the array's corresponding sampled value m; solve a system of equations to yield at least one of (i) an offset adjustment vector k, (ii) a sensitivity mismatch coefficient γ, and (iii) a non-orthogonality coefficient s, the system of equations being arranged to model each of the sampled values m as a function of: the respective one of the plurality of number arrays that is generated based on the sampled value m, the magnetic field that is associated with the rotating target, and the at least one of (i) the offset adjustment vector k, (ii) the sensitivity mismatch coefficient γ, and (iii) the non-orthogonality coefficient s; and store the at least one of (i) the offset adjustment vector k, (ii) the sensitivity mismatch coefficient γ, and (iii) the non-orthogonality coefficient s in a memory for use in adjusting at least one of the first signal and the second signal.

According to aspects of the disclosure, a system is provided comprising: means for obtaining at least three sampled values m, each of the sampled values m including a respective first component that is obtained based on a first signal and a respective second component that is obtained based on a second signal, the first signal being generated by first magnetic field sensing element in response to a magnetic field that is associated with a rotating target and the second signal being generated by a second magnetic field sensing element in response to the magnetic field that is associated with the rotating target, each of the at least three sampled values being associated with a different respective angular position of the rotating target; means for generating a plurality of number arrays based on the at least three sampled values m, each of the number arrays corresponding to a different respective sampled value m, each of the number arrays being based on a scaled or non-scaled value of the first component of the array's corresponding sampled value m and a scaled or non-scaled value of the second component of the array's corresponding sampled value m; means for solving a system of equations to yield at least one of (i) an offset adjustment vector k, (ii) a sensitivity mismatch coefficient γ, and (iii) a non-orthogonality coefficient s, the system of equations being arranged to model each of the sampled values m as a function of: the respective one of the plurality of number arrays that is generated based on the sampled value m, the magnetic field that is associated with the rotating target, and the at least one of (i) the offset adjustment vector k, (ii) the sensitivity mismatch coefficient γ, and (iii) the non-orthogonality coefficient s; and means for storing the at least one of (i) the offset adjustment vector k, (ii) the sensitivity mismatch coefficient γ, and (iii) the non-orthogonality coefficient s in a memory for use in adjusting at least one of the first signal and the second signal.

According to aspects of the disclosure, a non-transitory computer readable medium storing one or more processor-executable instructions is provided, which, when executed by a processing circuitry, cause the processing circuitry to perform the operations of: obtaining at least three sampled values m, each of the sampled values m including a respective first component that is obtained based on a first signal and a respective second component that is obtained based on a second signal, the first signal being generated by first magnetic field sensing element in response to a magnetic field that is associated with a rotating target and the second signal being generated by a second magnetic field sensing element in response to the magnetic field that is associated with the rotating target, each of the at least three sampled values being associated with a different respective angular position of the rotating target; generating a plurality of number arrays based on the at least three sampled values m, each of the number arrays corresponding to a different respective sampled value m, each of the number arrays being based on a scaled or non-scaled value of the first component of the array's corresponding sampled value m and a scaled or non-scaled value of the second component of the array's corresponding sampled value m; solving a system of equations to yield at least one of (i) an offset adjustment vector k, (ii) a sensitivity mismatch coefficient γ, and (iii) a non-orthogonality coefficient s, the system of equations being arranged to model each of the sampled values m as a function of: the respective one of the plurality of number arrays that is generated based on the sampled value m, the magnetic field that is associated with the rotating target, and the at least one of (i) the offset adjustment vector k, (ii) the sensitivity mismatch coefficient γ, (and (iii) the non-orthogonality coefficient s; and storing the at least one of (i) the offset adjustment vector k, (ii) the sensitivity mismatch coefficient γ, and (iii) the non-orthogonality coefficient s in a memory for use in adjusting at least one of the first signal and the second signal.

BRIEF DESCRIPTION OF THE DRAWINGS

The foregoing features may be more fully understood from the following description of the drawings in which.

DETAILED DESCRIPTION

Figure 1B:
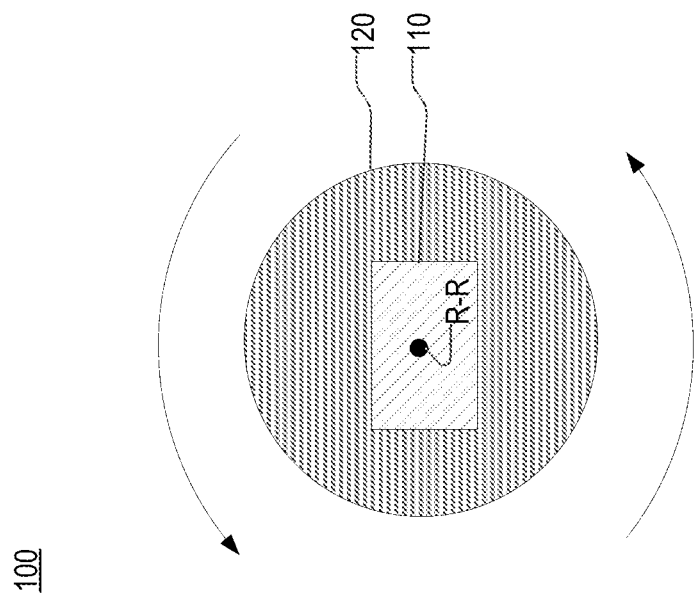
FIG. 1B is a bottom-up view of the system of FIG. 1A, according to aspects of the disclosure.
Figure 1A:
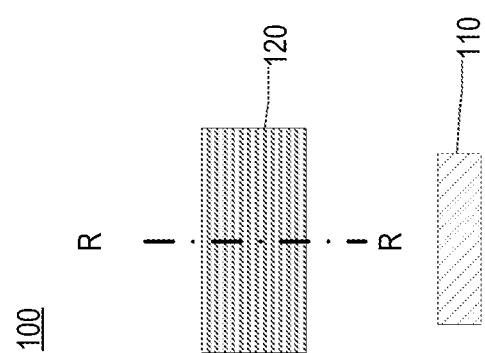
FIG. 1A is a side view of an example of a system, according to aspects of the disclosure.

FIG. 1A-B illustrate an example of a system 100, according to aspects of the disclosure. The system 100 may include a rotating target 120 and a sensor 110. The target 120 may be configured to rotate about an axis R-R. The sensor 110 may be disposed adjacent to the target 120 and detect one or more of speed of rotation, angular position, direction, and/or any other characteristic of the movement of the target. According to the example of FIGS. 1A-B, the target 120 is a permanent magnet. However, alternative implementations are possible in which the rotating target 120 includes an electromagnet, a gear, a ferromagnetic object which is used with a back biased magnet, a shaft, a wheel, and/or any other suitable type of element.

Figure 2:
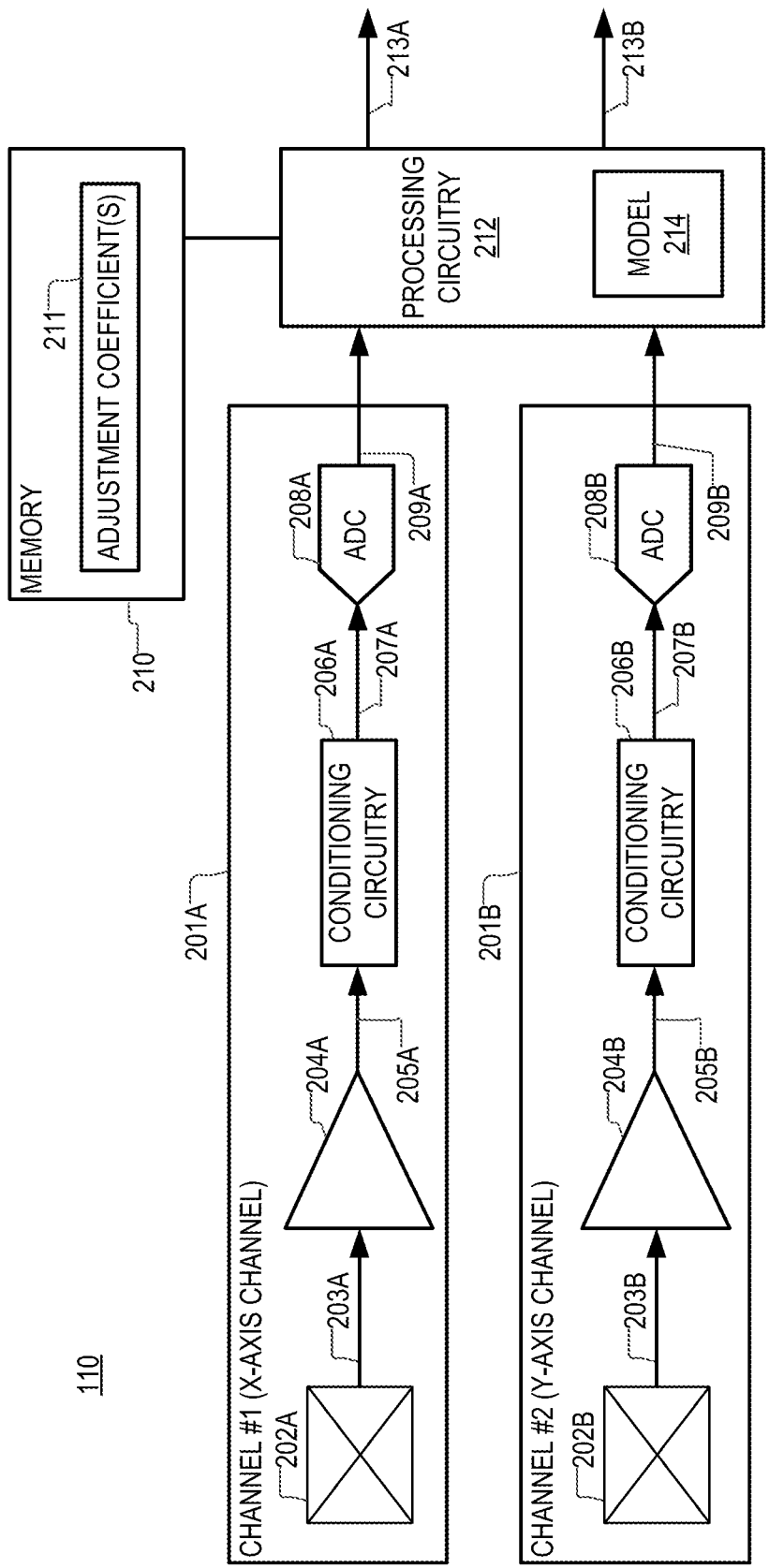
FIG. 2 is a diagram of an angle sensor, according to aspects of the disclosure.

FIG. 2 shows an example of the sensor 110, according to one example. As illustrated, the sensor 110 may include first channel 201A and a second channel 201B. The first channel 201A may include a magnetic field sensing element 202A, an amplifier 204A, a conditioning circuitry 206A, an analog-to-digital converter (ADC) 208A. The second channel 201B may include a magnetic field sensing element 202B, an amplifier 204B, a conditioning circuitry 206B, an analog-to-digital converter (ADC) 208B, a processing circuitry 212, and a memory 210.

The magnetic field sensing element 202A, according to the present example, may include one or more giant magnetoresistive (GMR) elements. However, alternative implementations are possible in which the magnetic field sensing element 202A includes another type of magnetic field sensing element, such as a Hall element or a tunnel magnetoresistive (TMR) element. In this regard, it will be understood that the present disclosure is not limited to any specific implementation of the magnetic field sensing element 202A. The conditioning circuitry 206A may include one or more filters for filtering a signal 205A that is output by the amplifier 204A. By way of example, the conditioning circuitry 206A may include a low-pass filter, a moving average filter (e.g., a sinc filter, etc.), and/or any other suitable type of filter. Stated succinctly, the present disclosure is not limited to any specific implementation of the conditioning circuitry 206A.

The magnetic field sensing element 202B, according to the present example, may include one or more giant magnetoresistive (GMR) elements. However, alternative implementations are possible in which the magnetic field sensing element 202B includes another type of magnetic field sensing element, such as a Hall element or a tunnel magnetoresistive (TMR) element. In this regard, it will be understood that the present disclosure is not limited to any specific implementation of the magnetic field sensing element 202B. The conditioning circuitry 206B may include one or more filters for filtering a signal 205B that is output by the amplifier 204B. By way of example, the conditioning circuitry 206B may include a low-pass filter, a moving average filter (e.g., a sinc filter, etc.), and/or any other suitable type of filter. Stated succinctly, the present disclosure is not limited to any specific implementation of the conditioning circuitry 206B.

The memory 210 may include any suitable type of volatile or non-volatile memory. According to the present example, the memory 210 includes a non-volatile memory, such as an Electrically Erasable Programmable Read-Only Memory (EEPROM). However, it will be understood that the present disclosure is not limited to any specific implementation of the memory 210.

The processing circuitry 212 may include one or more of analog circuitry, digital circuitry, digital logic, a general-purpose processor, a special-purpose processor, an application-specific processor, a digital circuit processor, a field-programmable gate array (FPGA), and/or any other suitable type of electronic circuit. Although the processing circuitry 212 is depicted as a monolithic block, it will be understood that in some implementations, the processing circuitry 212 may include a plurality of digital circuits.

In operation, the magnetic field sensing element 202A may generate a signal 203A in response to a magnetic field that is associated with the rotating target 120 (e.g., a magnetic field that is at least in part generated by the rotating target 120, etc.). The amplifier 204A may amplify the signal 203A to generate a signal 205A. The conditioning circuitry 206A may filter the signal 205A to generate a signal 207A. The ADC 208A may digitize the signal 207A to produce a signal 209A. Although the signals 203A, 205A, 207A, and 209A are referred to as different signals, it will be understood that each of the signals 205A, 207A, and 209A may be considered to be a different instance of the signal 203A. In this regard, the phrases "output of sensing element 202A" or "signal generated by sensing element 202A" may refer to any of the signals 203A, 205A, 207A, and 209B.

In operation, the magnetic field sensing element 202B may generate a signal 203B in response to a magnetic field that is associated with the rotating target 120 (e.g., a magnetic field that is at least in part generated by the rotating target 120, etc.) The amplifier 204B may amplify the signal 203B to generate a signal 205B. The conditioning circuitry 206B may filter the signal 205B to generate a signal 207B. The ADC 208B may digitize the signal 207B to produce a signal 209B. Although the signals 203B, 205B, 207B, and 209B are referred to as different signals, it will be understood that each of the signals 205B, 207B, and 209B may be considered to be a different instance of the signal 203B. In this regard, the phrases "output of sensing element 202B" or "signal generated by sensing element 202B" may refer to any of the signals 203B, 205B, 207B, and 209B.

In some implementations, the magnetic field sensing element 202A may have a first axis of maximum sensitivity and the magnetic field sensing element 202B may have a second axis of maximum sensitivity that is different from the first axis. Ideally, the first axis and the second axis may be orthogonal to each other. As a result, the signals 209A and 209B may be off-phase by ninety (90) degrees. The signals 209A and 209B may be used to determine the angular position of the rotating target 120 (e.g., by calculating the arctangent of the quotient of signals 209A-B, etc.).

A value of the signal 209A and a value of the signal 209B that are sampled at the same time (or within a predetermined sampling period) may be referred to as a "sampled value". A sampled value of signals 203A-B includes the values of signals 203A-B in the same time instant (or substantially the same time instant). The sampled value of signals 203A-B is essentially a vector whose direction matches the angular position of the target 120.

The processing circuitry 212 may be configured to evaluate a model 214 for calculating one or more adjustment coefficients 211 and store the adjustment coefficients in the memory 210. Furthermore, the processing circuitry 212 may be configured to adjust the output of at least one of the sensing elements 202A-B based on any of the adjustment coefficients 211. The adjustment coefficients 211 may include one or more of: (i) an offset adjustment vector that is used by the processing circuitry 212 to adjust the offset of one or more of signals 203A-B, (ii) a sensitivity mismatch coefficient that is used by the processing circuitry 212 to adjust the gain of one or more of the signals 203A-B, and (iii) a non-orthogonality coefficient that is used by the processing circuitry to adjust the gain of one or more of the signals 203A-B. The model 214 may be the same or similar to one of Models 1-3, which are discussed further below. In some implementations, the model 214 may be based on one of equations 19, 37, and 60, which are discussed further below. Although in the example of FIG. 2, the adjustment of signals 203A-B is performed in the digital domain, alternative implementations are possible where the adjustment is performed in the analog domain.

Figure 3B:
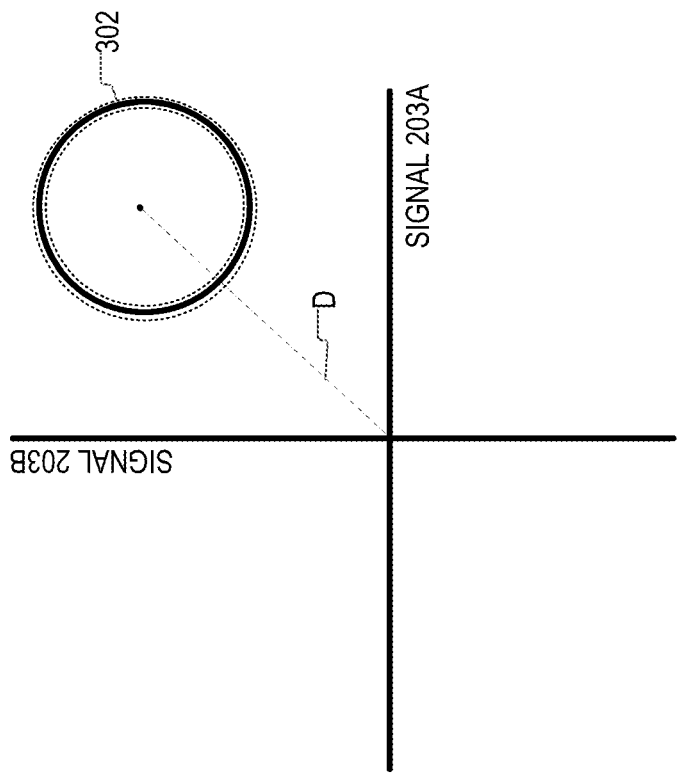
FIG. 3B is a plot of a sampled value distribution, according to aspects of the disclosure.
Figure 3A:
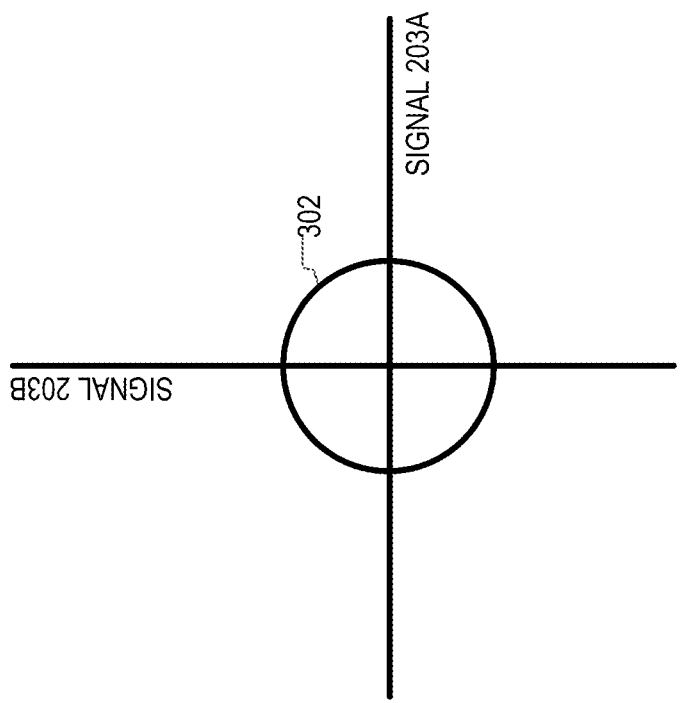
FIG. 3A is a plot of a sampled value distribution, according to aspects of the disclosure.

FIG. 3A illustrates a plot of a distribution 302 of the sample values of signals 203A-B. FIG. 3A shows the shape of the distribution 302 under ideal circumstances, in which no offset or gain is imparted on signals 203A-B (by a stray magnetic field) and no other distortions are present in the signals 203A-B, such as distortions that are the result of sensitivity mismatch or non-orthogonality. As noted above "a sampled value of signals 203A-B" may include the values of signals 203A-B in a particular moment of the rotation of target 120. FIG. 3A illustrates that, under ideal circumstances, the distribution of the sample values of signals 203A-B may be shaped as a circle that is centered on the origin of a coordinate system. The radius of the circle may be equal to the strength of the magnetic field associated with the target 120. Each sampled value of the signals 203A-B may be regarded as a vector that starts at the origin of the circle and ends on the circumference of the circle, and whose direction matches the angular position of the target 120.

FIG. 3B illustrates a plot of the distribution 302 in the presence of a stray magnetic field that is incident on the sensor 110. FIG. 3B illustrates that the stray magnetic field may cause the distribution 302 to be offset from the origin of the coordinate system by a distance D, which is equal to the magnitude of the stray magnetic field. In some implementations, the model 214 calculates the distance D that is present in the signals 203A-B based on sampled values of signals 203A-B. The calculated value for distance D is subsequently used as an offset adjustment vector to adjust (or trim) the signals 203A-B and correct for the effects of the stray magnetic field.

Figure 3D:
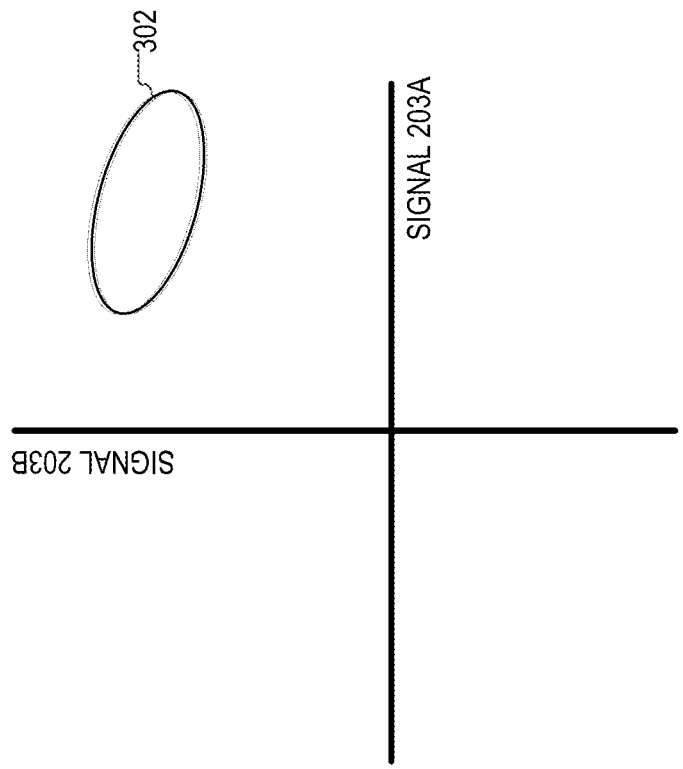
FIG. 3D is a plot of a sampled value distribution, according to aspects of the disclosure.
Figure 3C:
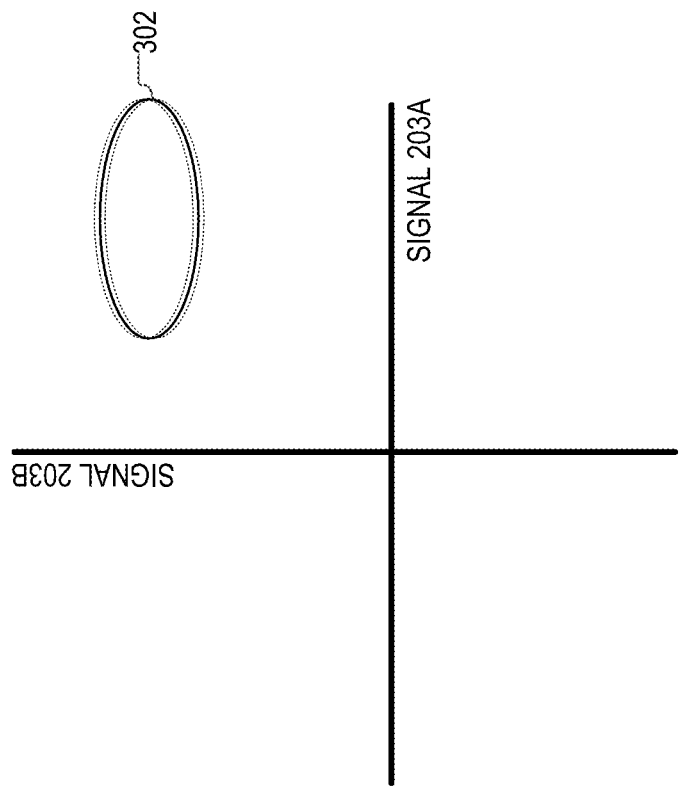
FIG. 3C is a plot of a sampled value distribution, according to aspects of the disclosure.

FIG. 3C illustrates a plot of the distribution 302 in the presence of: (i) of a sensitivity mismatch between channels 201A-B, and (ii) a stray magnetic field that is incident on the sensor 110. A sensitivity mismatch between the channels 201A and 201B may include a sensitivity mismatch between the sensing elements 202A and 202B, a sensitivity mismatch between the amplifiers 204A and 204B, etc. FIG. 3C illustrates that the distribution 302 may become flattened as a result of the sensitivity mismatch between channels 201A-B. In some implementations, the model 214 calculates the degree to which the distribution 302 is flattened based on sampled values of signals 203A-B. The calculated degree is subsequently used to derive a sensitivity mismatch coefficient for adjusting (or trimming) the signals 203A-B in order to correct for the sensitivity mismatch. Calculating the degree to which the distribution 302 is flattened may include calculating the smaller radius of the plot.

FIG. 3D illustrates a plot of the distribution 302 in the presence of: (i) orthogonality mismatch between sensing elements 202A-B (ii) sensitivity mismatch between channels 201A-B, and (iii) a stray magnetic field that is incident on the sensor 110. FIG. 3D illustrates that an orthogonality mismatch between the sensing elements 202A and 202B may cause the distribution 302 to become skewed. In some implementations, the model 214 calculates the degree to which the distribution 302 is skewed based on sampled values of signals 203A-B. The calculated degree is subsequently used to derive a non-orthogonality coefficient to adjust (or trim) the signals 203A-B and correct for the effects of the orthogonality mismatch. Calculating the degree to which the distribution 302 is skewed may include calculating the orthogonality mismatch between the sensing elements 202A-B. The sample values of signals 203A-B may be adjusted to correct for the orthogonality mismatch by using an orthogonality mismatch coefficient s. The orthogonality mismatch coefficients is the sinusoid of the excess, from 90 degrees, of the angle between the axis of maximum sensitivity of the sensing element 202A and the axis of maximum sensitivity of the sensing element 202B. The orthogonality mismatch coefficient s is discussed further below.

Figures 3E, 3F:
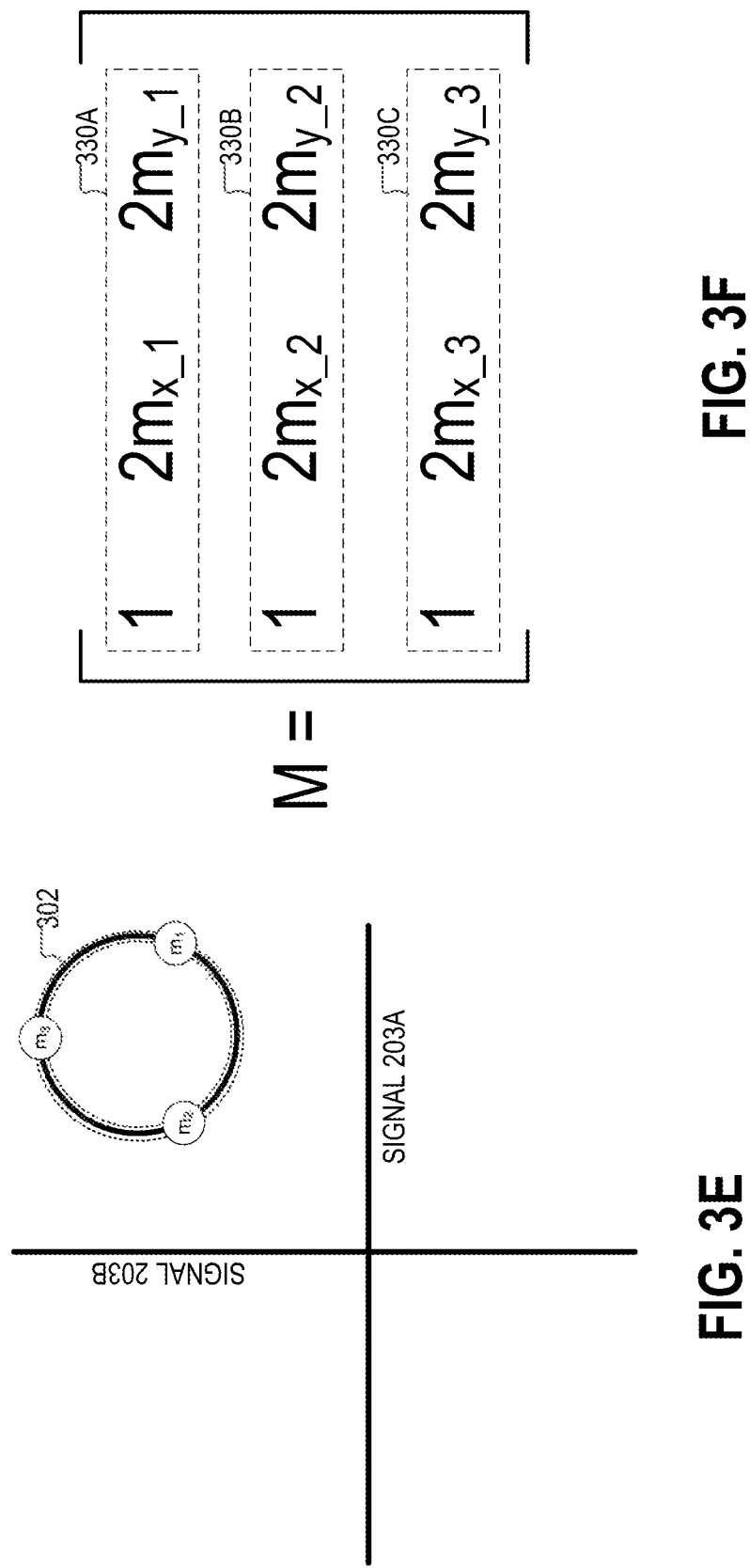
FIG. 3E is a plot illustrating a plurality of sampled values, according to aspects of the disclosure.
FIG. 3F is a diagram of a matrix that is generated based on the sampled values of FIG. 3E, according to aspects of the disclosure.

FIG. 3E illustrates sampled values $m_1$, $m_2$, and $m_3$ of signals 203A-B. Sampled value $m_1$ may be taken when the target 120 is at a first angular position, the sampled value $m_2$ may be taken when the target 120 is at a second angular position, and the sampled value $m_3$ may be taken when the target 120 is at a third angular position. Ideally the first, second, and third angular positions may be offset from each other by 120 degrees, however the present disclosure is not limited to any specific offset between the first, second, and third angular positions. Although in the present example the sampled values m1, m2, and m3 are taken at angular positions of the target 120, which are 120 degrees apart, the present disclosure is not limited thereto. In some implementations, the minimum angular distance between the positions at which the samples values m1, m2, and m3 are taken may depend on the standard deviation of angle noise.

Sampled value $m_1$ may include elements $m_{x\_1}$ and $m_{y\_1}$. Element $m_{x\_1}$ may be a single sample of the signal 203A or the average of a plurality of samples of the signal 203A that are taken at a very fast rate, while the target 120 is at substantially the same angular position. Element $m_{y\_1}$ may be a single sample of the signal 203B or the average of a plurality of samples of the signal 203B that are taken at a very fast rate, while the target 120 is at substantially the same angular position.

Sampled value $m_2$ may include elements $m_{x\_2}$ and $m_{y\_2}$. Element $m_{x\_2}$ may be a single sample of the signal 203A or the average of a plurality of samples of the signal 203A that are taken at a very fast rate, while the target 120 is at substantially the same angular position. Element $m_{y\_2}$ may be a single sample of the signal 203B or the average of a plurality of samples of the signal 203B that are taken at a very fast rate, while the target 220 is at substantially the same angular position.

Sampled value $m_3$ may include elements $m_{x\_3}$ and $m_{y\_3}$. Element $m_{x\_3}$ may be a single sample of the signal 203A or the average of a plurality of samples of the signal 203A that are taken at a very fast rate, while the target 120 is at substantially the same angular position. Element $m_{y\_3}$ may be a single sample of the signal 203B or the average of a plurality of samples of the signal 203B that are taken at a very fast rate, while the target 120 is at substantially the same angular position.

In some respects, setting the values of the elements of sampled values $m_{1-3}$ to equal the average of a plurality of signal samples is advantageous because it may filter out noise or other transient errors that are present in the signals 203A-B.

FIG. 3F shows an example of a matrix M, which the model 214 can be evaluated against. The matrix M may include number arrays 330A-C. Number array 330A is generated based on sample value $m_1$. The first element of number array 330A is the magnitude of the magnetic field associated with the target 120 (or the radius of the distribution 302). The remaining two elements of number array 330B-C are components $m_{x\_1}$ and $m_{y\_1}$ of sampled value $m_1$. Number array 330B is generated based on sample value $m_2$. The first element of number array 330B is the magnitude of the magnetic field associated with the target 120 (or the radius of the distribution 302). The remaining two elements of number array 330B are components $m_{x\_2}$ and $m_{y\_2}$ of sampled value $m_2$. Number array 330C is generated based on sample value $m_3$. The first element of number array 330C is the magnitude of the magnetic field associated with the target 120 (or the radius of the distribution 302). The remaining two elements of number array 330C are components $m_{x\_3}$ and $m_{y\_3}$ of sampled value $m_3$. In some implementations, each of the number arrays 330 in the matrix M may include additional elements. As illustrated in equations 37 and 60, each of the additional elements, in any given one of the number arrays in the matrix M, may be based on one or more of the components $m_{i\_x}$ and $m_{i\_y}$, of the given sampled value m.

Figure 4:
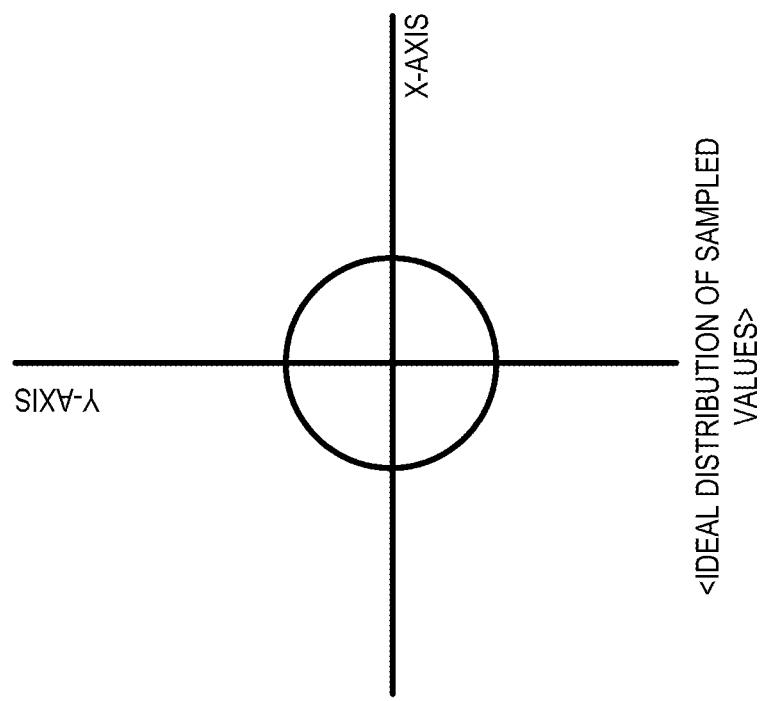
FIG. 4 is a diagram of illustrating the operation of a process for adjusting the output of magnetic field sensing elements, according to aspects of the disclosure.
Figure 4:
Figure 4:
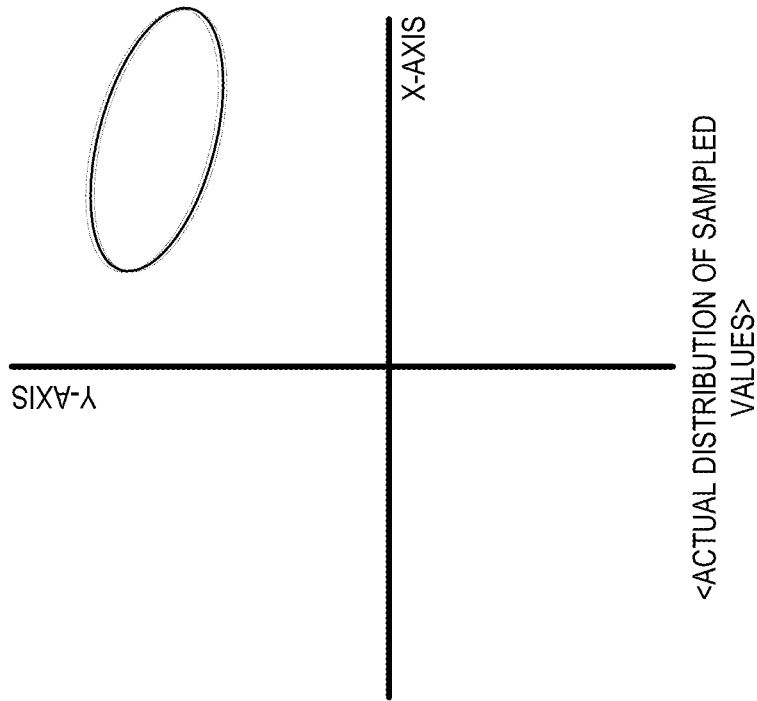

FIG. 4 is a diagram illustrating a process for adjusting signals 203A-B to correct for the offsets and distortions that are discussed with respect to FIGS. 3A-D. FIG. 4 illustrates that adjusting the signals 203A-B may have the effect of restoring the distribution 302 to its ideal shape and position. As noted above, the adjustment may be performed by using the model 214. The model 214 relies on the observation that the distribution of the sample values of signals 203A-B has a circular (or oval shape), with a radius that is known ahead of time. When solved, the model may yield one or more adjustment coefficients, which ideally can be used to effect a transformation of the actual distribution of the sampled values of signals 203A-B (also shown in FIGS. 3B-D) to the ideal distribution (also shown in FIG. 3A).

In the example of FIG. 2B, the model 214 is evaluated by the processing circuitry of the sensor 110. However, alternative implementations are possible in which the model is evaluated by a calibration system 502 (shown in FIG. 5). Furthermore, alternative implementations are possible in which the model 214 is evaluated by any computing device, such as the computing device 600, which is shown in FIG. 6.

Figure 5:
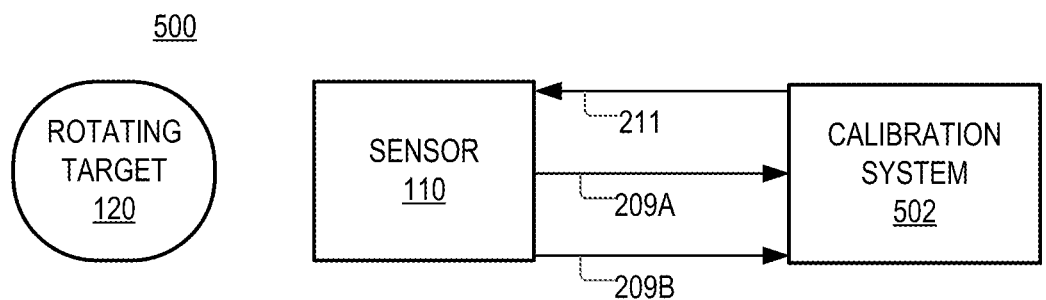
FIG. 5 is a diagram of an example of a system, according to aspects of the disclosure.

FIG. 5 shows is a diagram of a system 500, according to aspects of the disclosure. As illustrated, the system 500 may include the sensor 110, the rotating target 120, and a calibration system 502. In operation, the calibration system 502 may receive the signals 209A and 20B from the sensor 110. Next, the calibration system 502 may calculate the one or more adjustment coefficients 211 based on the signals 209A-B and the model 214. And finally, the calibration system 502 may provide the one or more adjustment coefficients 211 to the sensor 110 for storage in the memory 210.

Figure 6:
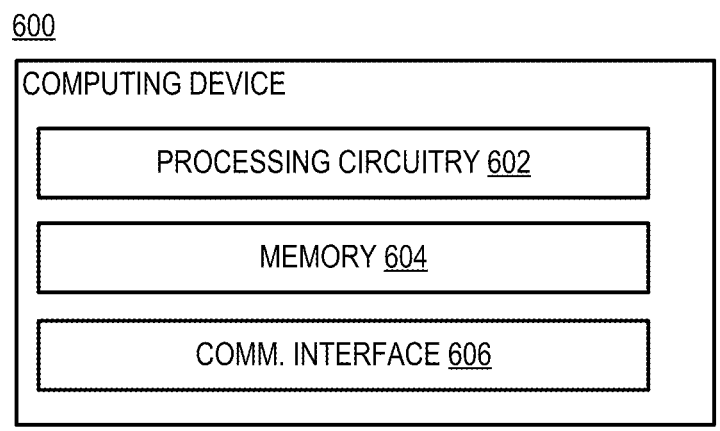
FIG. 6 is a diagram of an example of a computing device, according to aspects of the disclosure.

FIG. 6 is a diagram of an example of a computing device 600, according to aspects of the disclosure. As illustrated, the computing device 600 may include a processing circuitry 602, a memory 604, and a communications interface 606. The processing circuitry 602 may include one or more of a general-purpose processor, a special-purpose processor, an application-specific integrated circuit (ASIC), a field-programmable gate array (FPGA), and/or any other suitable type of processing circuitry. The memory 604 may include any suitable type of volatile or non-volatile memory. The memory 604 may include one or more of a random-access memory, flash memory, Electrically Erasable Programmable Read-Only Memory (EEPROM), a solid-state drive (SSD), a hard-disk, and/or any other suitable type of memory. The communications interface may include any suitable type of communications interface, such as one or more of an inter-integrated circuit (I2C) interface, a Universal Serial Bus interface, a controller area network (CAN bus) interface, an Ethernet interface, and/or any other interface for receiving a signal that is output by the sensor 110.

Figure 7A:
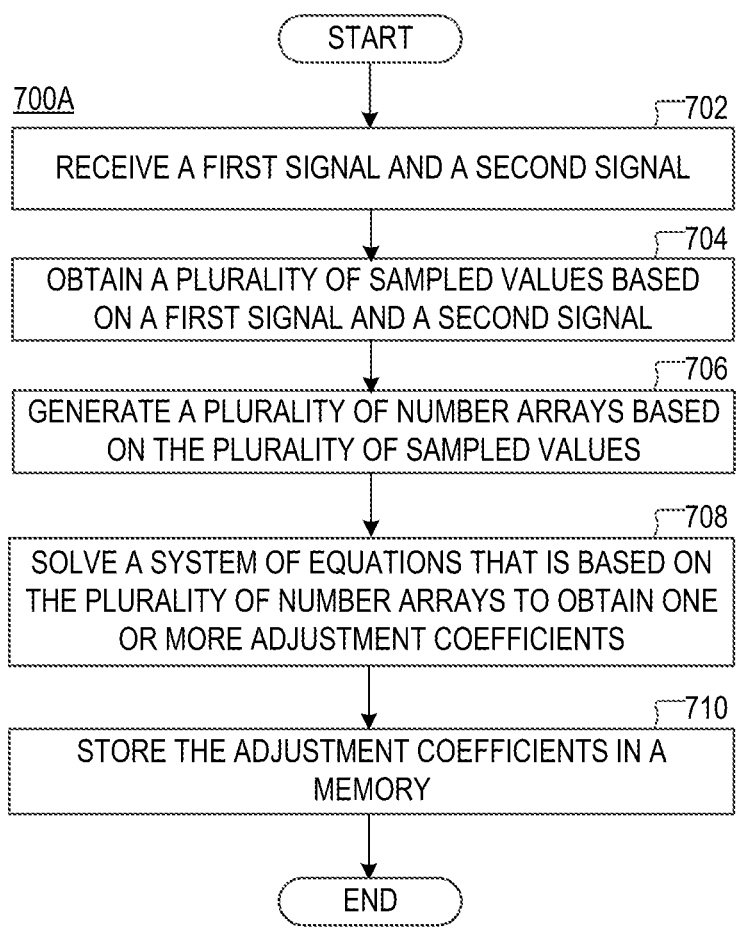
FIG. 7A is a flowchart of an example of a process, according to aspects of the disclosure.

FIG. 7A is a flowchart of an example of a process 700A, according to aspects of the disclosure. According to the present example, the process 700A is executed by the processing circuitry 212 of the sensor 110 (shown in FIG. 2). However, alternative implementations are possible in which the process 700A is executed by the calibration system 502 (shown in FIG. 5) and/or the computing device 600 (shown in FIG. 6). At step 702, the signal 209A and the signal 209B are received. At step 704 at least three sampled values m are obtained based on the first signal 209A and 209B. The sampled values may be the same or similar to the sampled values $m_1$, $m_2$, and $m_3$, which are discussed above with respect to FIG. 3E. As discussed further below, depending on the exact implementation of the model, more than three sampled values may be obtained in some instances. At step 706, a plurality of number arrays is generated based on the plurality of sampled values. The plurality of number arrays may be the same or similar to then number arrays 330A-C, which are discussed above with respect to FIG. 3F. In some implementations, a different sample array may be generated for each of the sampled values obtained at step 704, and each of the sampled arrays may be generated based on a different one of the sampled values. At step 708, the processing circuitry 212 generates one or more adjustment coefficients 211 by evaluating the model 214. The one or more adjustment coefficients may include at least one of: (i) an offset adjustment vector k, (ii) a sensitivity mismatch coefficient γ, and (iii) a non-orthogonality coefficient s. Examples of different methods for generating the one or more adjustment coefficients are discussed further below with respect to Models. In some implementations, one or more of (i) the offset adjustment vector k, (ii) the sensitivity mismatch coefficient γ, and (iii) the non-orthogonality coefficient s may be calculated by solving one of equations 19, 37, and 60 based on the sampled values obtained at step 704. Equations 19, 37, and 60 are discussed further below.

At step 710, the processing circuitry 212 stores the one or more coefficients 211 in the memory 210. According to the example of FIG. 7A, the coefficients are stored in the memory of the sensor 110, however in instances in which the process 700A is executed by another device (such as the calibration system 502 or the device 600), the one or more coefficients 211 may be stored in the memory of another device. In some implementations, the processing circuitry 212 may adjust the signals 209A and 209B based on the coefficients.

Figure 7B:
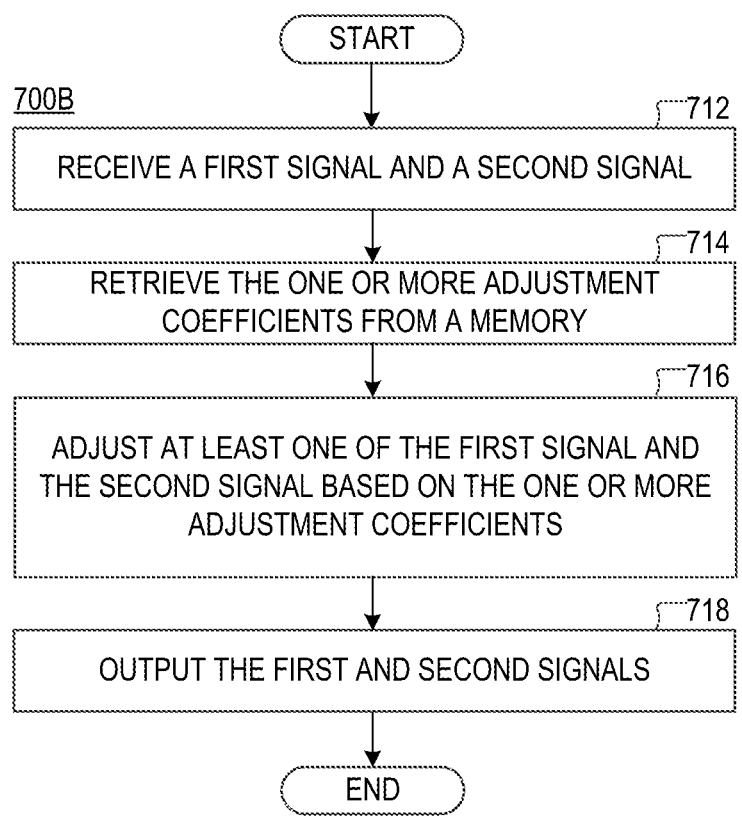
FIG. 7B is a flowchart of an example of a process, according to aspects of the disclosure.

FIG. 7B is a flowchart of an example of a process 700B, according to aspects of the disclosure. According to the present example, the process 700B is performed by processing circuitry 212. However, alternative implementations are possible in which the process 700B is performed by an external computing device. At step 712, the processing circuitry 212 receives the signals 209A and 209B. At step 714, the processing circuitry retrieves the one or more coefficients 211 from the memory 210. At step 716 at least one of the signals 209A and 209B is adjusted based on the one or more coefficients. Depending on the implementation of the model 214, the adjustment may be performed based on the relationships presented in equations 1-66 below. At step 718, the adjusted signals 209A and 209B are output as signals 213A and 213B, respectively.

The discussion that follows provides examples of Models 1-3, which can be used to calculate different adjustment coefficients for trimming the output of the sensing elements 202A-B. Models 1-3 can be regarded as different subspecies of the same general. As noted above, model 214 may be the same or similar to any of Models 1-3.

MODEL 1

Model 1 is a mathematical model that can be used to calculate an offset adjustment vector k. Model 1 presumes that there is no gain mismatch between the sensing elements 202A-B. Furthermore, Model 1 models noise that The offset adjustment vector k includes elements $k_x$ and $k_y$. Element $k_x$ is based on element $o_x$ of an offset adjustment vector o, which can be used to adjust the offset of signal 203A. Element $k_y$ is based on element $o_y$ of an offset adjustment vector o, which can be used to adjust the offset of signal 203B. The offset adjustment vector o is related to the offset adjustment vector k by equation 4 below. As used throughout the disclosure, the term offset adjustment vector may refer to either one of offset adjustment vector o or the offset adjustment vector k.

Model 1 is presented in the context of a target magnetic field at sample time i: $b_i=[b_{x_i} b_{y_i}]^T$. The magnitude of the magnetic field b is $b^2=||b_i||^2$. The target magnetic field $b_i$ is the true value of the magnetic field that is generated by the target 120. The target magnetic field $b_i$ is constant over time (e.g., when the target 120 is a permanent magnet, etc.). The output of the sensing elements 202A-B at time i is, $m_i=[m_{x_i} m_{y_i}]^T$, where $m_i$. Is the same or similar to any of the sampled values m discussed above with respect to FIG. 3F. Each value $m_i$ is also referred to as sensed magnetic field $m_i$. As is discussed further below, solving Model 1 based on sampled values m of the signals 203A-B may yield the offset adjustment vector. These coefficients can be used to derive the value of the target magnetic field b from the measured magnetic field $m_i$, based on the relationships that are described below by equations 21-24.

Model 1 is based on the following terms:

Stray field: $f=[f_x, f_y]^T$. Considered to be constant over time); This term models a stray field that is incident on the sensing elements 202A-B.

Sensitivity matrix:

$$S = S_o \begin{bmatrix} 1 & 0 \\ 0 & 1 \end{bmatrix}$$

(considered to be constant over time);

Electrical gain matrix:

$$G = G_o \begin{bmatrix} 1 & 0 \\ 0 & 1 \end{bmatrix}$$

(considered to be constant over time);

Noise vector at sample time i: $n_i=[n_{x_i}, n_{y_i}]^T$ (considered to be zero mean, not necessarily white, independence between components $$\mu_{n_{x_i}} = \mu_{n_{y_i}} = \mu_n = 0,$$

$E[n_{x_i} n_{y_j}]=0 \forall i, j$, both channels having same power $\sigma_{n_x}^2 = \sigma_{n_y}^2 = \sigma_n^2$, and also uncorrelated with the input signal and the offset, i.e. $E[(b_i+f+o)n_i^T]=0)$.

sensitivity and gain product: $A_0$—In some implementations, the value of $A_0$ may be set to equal the actual gain of the analog front-end amplifier(s) 205A-B.

A detailed derivation of Model 1 is provided as follows. The sensed field m may be modeled by Equation 1 below:

$$m_i = G(S(b_i+f)+o)+n_i \tag{1}$$

Let:

$$m_i = Ab_i + k + n_i \tag{2}$$

where $$A = GS = A_0 \begin{bmatrix} 1 & 0 \\ 0 & 1 \end{bmatrix},$$

and it is constant over time (3)

$$k = GSf + Go = \begin{bmatrix} k_x \\ k_y \end{bmatrix},$$

and it is constant over time (4)

$A_0 = G_0 S_0$, and it is constant over time (5)

$$A^{-1} = (A^{-1})^T = \frac{1}{A_0} \begin{bmatrix} 1 & 0 \\ 0 & 1 \end{bmatrix} \tag{6}$$

$$(A^{-1})^T A^{-1} = \frac{1}{A_0^2} \begin{bmatrix} 1 & 0 \\ 0 & 1 \end{bmatrix} \tag{7}$$

$$E[m_i n_i^T] = E\left[\begin{bmatrix} m_{x_i} \\ m_{y_i} \end{bmatrix} [n_{x_i} \ n_{y_i}]\right] = \begin{bmatrix} \sigma_{n_x}^2 & 0 \\ 0 & \sigma_{n_y}^2 \end{bmatrix} = \sigma_n^2 \begin{bmatrix} 1 & 0 \\ 0 & 1 \end{bmatrix} \tag{8}$$

The target magnetic field sample $b_i$ may be modeled by equation 9 below:

$$b_i = A^{-1}(m_i - k - n_i) \tag{9}$$

Equation 10 below can be derived from equation 9 as follows:

$$\|b_i\|^2 = b_i^T b_i \tag{10}$$

$$= (m_i - k - n_i)^T (A^{-1})^T A^{-1} (m_i - k - n_i)$$

$$= [m_{x_i} - k_x - n_{x_i} \ m_{y_i} - k_y - n_{y_i}] \frac{1}{A_0^2} \begin{bmatrix} 1 & 0 \\ 0 & 1 \end{bmatrix} \begin{bmatrix} m_{x_i} - k_x - n_{x_i} \\ m_{y_i} - k_y - n_{y_i} \end{bmatrix}$$

$$= \frac{1}{A_0^2} \begin{bmatrix} m_{x_i}^2 + k_x^2 - 2m_{x_i} k_x - 2m_{x_i} n_{x_i} + 2k_x n_{x_i} + n_{x_i}^2 \\ + \\ m_{y_i}^2 + k_y^2 - 2m_{y_i} k_y - 2m_{y_i} n_{y_i} + 2k_y n_{y_i} + n_{y_i}^2 \end{bmatrix}$$

Taking the statistical expectation at both sides of equation 10 yields equations 11-12 below:

$$E[\|b_i\|^2] = \tag{11}$$

$$\|b_i\|^2 = \frac{1}{A_0^2}(E[\|m_i\|^2] + k_x^2 + k_y^2 - 2E[m_{x_i}]k_x - 2E[m_{y_i}]k_y - 2\sigma_n^2)$$

$$E[\|m_i\|^2] = A_0^2 \|b_i\|^2 + 2\sigma_n^2 - \|k\|^2 + 2E[m_{x_i}]k_x + 2E[m_{y_i}]k_y \tag{12}$$

$$= [1 \ 2E[m_{x_i}] \ 2E[m_{y_i}]] \begin{bmatrix} A_0^2 \|b_i\|^2 - \|k\|^2 + 2\sigma_n^2 \\ k_x \\ k_y \end{bmatrix}$$

Equation 12 below can be derived from equation 11, as follows:

$$\begin{bmatrix} E[\|m_1\|^2] \\ E[\|m_2\|^2] \\ E[\|m_3\|^2] \end{bmatrix} = \begin{bmatrix} 1 & 2E[m_{x_1}] & 2E[m_{y_1}] \\ 1 & 2E[m_{x_2}] & 2E[m_{y_2}] \\ 1 & 2E[m_{x_3}] & 2E[m_{y_3}] \end{bmatrix} \begin{bmatrix} A_0^2 \|b_i\|^2 - \|k\|^2 + 2\sigma_n^2 \\ k_x \\ k_y \end{bmatrix} \tag{13}$$

Where $m_1$, $m_2$, and $m_3$ are the sampled values discussed above with respect to FIG. 3E.

In some respects, if $b_i \neq b_j$ then $E[m_i] \neq E[m_j] \forall i, j=1,2,3$, $i \forall j$, the equation can be perfectly solved. In practice, the expected values are unknown since all sample values $m_1$ are corrupted by noise. In some implementations, statistical expectation can be replaced by time average but that should imply to sample several times the same target position in order to average them, filtering out noise.

Considering the above observation, target magnetic field sample $b_i$ may be also modeled by equation 14 below:

$$\|b_i\|^2 = \frac{1}{A_0^2} \begin{bmatrix} m_{x_i}^2 + k_x^2 - 2m_{x_i} k_x - 2m_{x_i} n_{x_i} + 2k_x n_{x_i} + n_{x_i}^2 \\ + \\ m_{y_i}^2 + k_y^2 - 2m_{y_i} k_y - 2m_{y_i} n_{y_i} + 2k_y n_{y_i} + n_{y_i}^2 \end{bmatrix} \tag{14}$$

$$= \frac{1}{A_0^2}[\|m_i\|^2 + \|k\|^2 - 2m_{x_i} k_x - 2m_{y_i} k_y + n_i']$$

where $$n'_i = n_{x_i}^2 + n_{y_i}^2 + 2k_x n_{x_i} + 2k_y n_{y_i} - 2m_{x_i} n_{x_i} - 2m_{y_i} n_{y_i} \quad (15)$$
$$= -(n_{x_i}^2 + n_{y_i}^2) - 2A_0(b_{x_i} n_{x_i} + b_{y_i} n_{y_i})$$
$$= -2\sigma_n^2 + 2\sigma_n^2 - (n_{x_i}^2 + n_{y_i}^2) - 2A_0(b_{x_i} n_{x_i} + b_{y_i} n_{y_i})$$
$$= -2\sigma_n^2 - \varepsilon_i$$

A noise term $\xi_i$ may be introduced to model the error that is present in the output of the sensing elements 202A-B. The term $\xi_i$ may be defined by equation 16 below:

$$\xi_i = -2\sigma_n^2 + (n_{x_i}^2 + n_{y_i}^2) + 2A_0(b_{x_i} n_{x_i} + b_{y_i} n_{y_i}) \text{ and } E[\xi]=0. \quad (16)$$

The value of each sample m may then be expressed in terms of $\xi_i$, as follows:

$$\|m_i\|^2 = A_0^2 \|b_i\|^2 - \|k\|^2 + 2m_{x_i} k_x + 2m_{y_i} k_y - n'_i \quad (17)$$
$$= [1 \quad 2m_{x_i} \quad 2m_{y_i}] \begin{bmatrix} A_0^2 \|b_i\|^2 - \|k\|^2 + 2\sigma_n^2 \\ k_x \\ k_y \end{bmatrix} + \varepsilon_i$$

Using a least-squares fitting, equation 17 may be solved to yield equation 18 below:

$$\begin{bmatrix} \|m_1\|^2 \\ \|m_2\|^2 \\ \|m_3\|^2 \\ \vdots \\ \|m_N\|^2 \end{bmatrix} = \begin{bmatrix} 1 & 2m_{x_1} & 2m_{y_1} \\ 1 & 2m_{x_2} & 2m_{y_2} \\ 1 & 2m_{x_3} & 2m_{y_3} \\ \vdots & \vdots & \vdots \\ 1 & 2m_{x_N} & 2m_{y_N} \end{bmatrix} \begin{bmatrix} A_0^2 \|b_i\|^2 - \|k\|^2 + 2\sigma_n^2 \\ k_x \\ k_y \end{bmatrix} + \begin{bmatrix} \varepsilon_1 \\ \varepsilon_2 \\ \varepsilon_3 \\ \vdots \\ \varepsilon_N \end{bmatrix} \quad (18)$$

Consider equation 18, and let:

$$m = \begin{bmatrix} \|m_1\|^2 \\ \|m_2\|^2 \\ \|m_3\|^2 \\ \vdots \\ \|m_N\|^2 \end{bmatrix}; M = \begin{bmatrix} 1 & 2m_{x_1} & 2m_{y_1} \\ 1 & 2m_{x_2} & 2m_{y_2} \\ 1 & 2m_{x_3} & 2m_{y_3} \\ \vdots & \vdots & \vdots \\ 1 & 2m_{x_N} & 2m_{y_N} \end{bmatrix};$$

$$v = \begin{bmatrix} A_0^2 \|b_i\|^2 - \|k\|^2 + 2\sigma_n^2 \\ k_x \\ k_y \end{bmatrix}; \varepsilon = \begin{bmatrix} \varepsilon_1 \\ \varepsilon_2 \\ \varepsilon_3 \\ \vdots \\ \varepsilon_N \end{bmatrix}$$

In some respects, equation 18 expresses the norm squared of the magnetic field b as a function of the sampled values m.

Then the optimal solution which minimizes $\|\xi\|^2$ is:

$$\hat{v} = (M^T M)^{-1} M^T m = \begin{bmatrix} A_0^2 \|b_i\|^2 - \|\hat{k}\|^2 + 2\sigma_n^2 \\ \hat{k}_x \\ \hat{k}_y \end{bmatrix} \quad (19)$$

In some implementations, step 708 of the process 700A may be performed by solving equation 19 to obtain the values of the offset adjustment vector k. As noted above, each of the sampled values m in equation 19 is the same or similar to the sampled values m of signals 202A-B that are discussed above with respect to FIG. 3E. Each of the sampled values m may be obtained by sampling the signals 203A-B. The generalized inverse $(M^T M)^{-1} M^T$ (also called the Moore-Penrose pseudo inverse) can be found by any numeric method (like Recursive Least-squares—RLS or any other model with/without forgetting old sampled values in order to allow keeping track of parameters variations over time due to for example temperature drift). According to the present disclosure, $\hat{v}$ is the optimum solution of v. Furthermore, $b^2 A_0$ may be equal to the square norm of the magnetic field multiplied by the gain of the amplifier 204A-B. In some implementations, the technique described with respect to Models 2 and 3, also. That is, any of Models 2 and 3 may be modified to include a noise term $\xi$ in the manner shown with respect to Model 1, and any of Models 2 and 3 may be solved to minimize the value of $\|\xi\|^2$.

Finally, the best least-squares estimation obtained with N samples is:

$$A_0 \hat{b}_i = m_i - \hat{k} \quad (20)$$

It should be noted that that this method is valid as long as $b_i \neq b_j$, $i \neq j$, which implies a moving target but not necessarily a full turn is required even knowing the real target angle.

MODEL 2

Model 2 is a more generalized version of Model 1. Model 2 can be used to calculate an offset adjustment vector k, as well as a sensitivity mismatch coefficient $\gamma$. The sensitivity mismatch coefficient $\gamma$ can be used to compensate for the sensitivity mismatch between the sensing elements 202A-B.

The offset adjustment vector k includes elements $k_x$ and $k_y$. Element $k_x$ is based on element $o_x$ of an offset adjustment vector o, which can be used to adjust the offset of signal 203A. Element $k_y$ is based on element $o_y$ of an offset adjustment vector o, which can be used to adjust the offset of signal 203B. The offset adjustment vector o is related to the offset adjustment vector k by equation 24 below. As used throughout the disclosure, the term offset adjustment vector may refer to either one offset adjustment vector o or the offset adjustment vector k.

Model 2 is presented in the context of a target magnetic field at sample time i: $b_i = [b_{x_i}, b_{y_i}]^T$. The magnitude of the magnetic field b is $b^2 = \|b_i\|^2$. The target magnetic field $b_i$ is the true value of the magnetic field that is generated by the target 120. The target magnetic field $b_i$ is constant over time (e.g., when the target 120 is a permanent magnet, etc.). The output of the sensing elements 202A-B at time i is, $m_i = [m_{x_i}, m_{y_i}]^T$, where $m_i$. Is the same or similar to any of the sampled values m discussed above with respect to FIG. 3F. Each value $m_i$ is also referred to as sensed magnetic field $m_i$. As is discussed further below, solving Model 2 based on a set of sampled values of signals 203A-B may yield the offset adjustment vector, and the sensitivity mismatch coefficient. These coefficients can be used to derive (or better approximate) the value of the target magnetic field $b_i$, from the measured magnetic field $m_i$, in accordance with the relationships that are described below by equations 21-24.

Model 2 is based on the following terms:

Stray field: $f = [f_x, f_y]^T$ (considered to be constant over time)

Offset: $o = [o_x, o_y]^T$ (considered to be constant over time)

Sensitivity matrix:

$$S = S_o \begin{bmatrix} 1 + \Delta_s & 0 \\ 0 & 1 - \Delta_s \end{bmatrix}$$

(considered to be constant over time)

Electrical gain matrix:

$$G = G_o \begin{bmatrix} 1+\Delta_G & 0 \\ 0 & 1-\Delta_G \end{bmatrix}$$

considered to be constant over time)

The sensed field m may be modeled by Equation 21 below:

$$m_i = G(S(b_i+f)+o) \quad (21)$$

Let:

$$m_i = Ab_i + k \quad (22)$$

where $$A = GS = A_0 \begin{bmatrix} 1+\Delta_A & 0 \\ 0 & 1-\Delta_A \end{bmatrix},$$

and is constant over time (23)

$$k = GSf + Go = \begin{bmatrix} k_x \\ k_y \end{bmatrix},$$

and is constant over time (24)

$A_0 = G_0 S_0 (1+\Delta_G \Delta_S)$, and is constant over time (25)

$$\Delta_A = \frac{\Delta_G + \Delta_s}{1+\Delta_G \Delta_s},$$

and is constant over time (26)

$$A^{-1} = (A^{-1})^T = \frac{1}{A_0(1-\Delta_A^2)} \begin{bmatrix} 1-\Delta_A & 0 \\ 0 & 1+\Delta_A \end{bmatrix} \quad (27)$$

$$(A^{-1})^T A^{-1} = \frac{1}{A_0^2(1-\Delta_A^2)^2} \begin{bmatrix} (1-\Delta_A)^2 & 0 \\ 0 & (1+\Delta_A)^2 \end{bmatrix} \quad (28)$$

$$b_i = A^{-1}(m_i - k) \quad (29)$$

-continued $$b^2 = \|b_i\|^2 = b_i^T b_i = (m_i - k)^T (A^{-1})^T A^{-1} (m_i - k) \quad (30)$$

$$= [m_{x_i} - k_x \; m_{y_i} - k_y] \frac{1}{A_0^2(1-\Delta_A^2)^2} \begin{bmatrix} (1-\Delta_A)^2 & 0 \\ 0 & (1+\Delta_A)^2 \end{bmatrix} \begin{bmatrix} m_{x_i} - k_x \\ m_{y_i} - k_y \end{bmatrix}$$

$$= \frac{1}{A_0^2(1-\Delta_A^2)^2} [(m_{x_i} - k_x)^2(1-\Delta_A)^2 + (m_{y_i} - k_y)^2(1+\Delta_A)^2]$$

$$= \frac{1}{A_0^2(1-\Delta_A^2)^2}$$

$$\begin{bmatrix} m_{x_i}^2(1-\Delta_A)^2 + k_x^2(1-\Delta_A)^2 - 2m_{x_i}k_x(1-\Delta_A)^2 + m_{y_i}^2(1+\Delta_A)^2 + \\ k_y^2(1+\Delta_A)^2 - 2m_{y_i}k_y(1+\Delta_A)^2 \end{bmatrix}$$

From equations 23-30, it follows:

$$b^2 A_0^2(1-\Delta_A^2)^2 = \begin{bmatrix} m_{x_i}^2(1-\Delta_A)^2 + m_{y_i}^2(1+\Delta_A)^2 + k_x^2(1-\Delta_A)^2 + \\ k_y^2(1+\Delta_A)^2 - 2m_{x_i}k_x(1-\Delta_A)^2 - 2m_{y_i}k_y(1+\Delta_A)^2 \end{bmatrix} \quad (31)$$

$$m_{x_i}^2(1-\Delta_A)^2 = \quad (32)$$

$$\begin{bmatrix} m_{x_i}^2(1-\Delta_A)^2 = b^2 A_0^2(1-\Delta_A^2)^2 - k_x^2(1-\Delta_A)^2 - k_y^2(1+\Delta_A)^2 + \\ 2m_{x_i}k_x(1+\Delta_A)^2 + 2m_{y_i}k_y(1+\Delta_A)^2 - m_{y_i}^2(1+\Delta_A)^2 \end{bmatrix}$$

$$m_{x_i}^2 = \quad (33)$$

$$\begin{bmatrix} m_{x_i}^2(1-\Delta_A)^2 = b^2 A_0^2(1-\Delta_A^2)^2 - k_x^2(1-\Delta_A)^2 - k_y^2(1+\Delta_A)^2 + \\ 2m_{y_i}k_y \frac{(1+\Delta_A)^2}{(1-\Delta_A)^2} - m_{y_i}^2 \frac{(1+\Delta_A)^2}{(1-\Delta_A)^2} k_x(1-\Delta_A)^2 + 2m_i k_y(1+\Delta_A)^2 - m_{y_i}^2(1+\Delta_A)^2 \end{bmatrix}$$

$$\gamma = \frac{1+\Delta_A}{1-\Delta_A} \quad (34)$$

As illustrated by Equation 34, the sensitivity mismatch coefficient $\gamma$ is equal to the ratio of the sensitivity of sensing element 202A and the sensitivity of the sensing element 202B (and/or the ratio of the sensitivities of channels 201A-B). The term $\Delta_A$ (which is also found in Model 3) represents the difference in sensitivity between sensing elements 202A-B or channels 201A-B.

$$m_{x_i}^2 = b^2 A_0^2 \frac{(1-\Delta_A^2)^2}{(1-\Delta_A)^2} - (k_x^2 + k_y^2 \gamma^2) + 2m_{x_i}k_x + 2m_{y_i}k_y \gamma^2 - m_{y_i}^2 \gamma^2 \quad (35)$$

$$m_{x_i}^2 = [1 \; 2m_{x_i} \; 2m_{y_i} \; -m_{y_i}^2] \begin{bmatrix} b^2 A_0^2 \frac{(1-\Delta_{A2})^2}{(1-\Delta_A)^2} - (k_x^2 + k_y^2 \gamma^2) \\ k_x \\ k_y \gamma^2 \\ \gamma^2 \end{bmatrix} \quad (36)$$

Using N sampled values m of signals 203A-B, equation 36 may be re-written as follows:

$$\begin{bmatrix} m_{x_1}^2 \\ m_{x_2}^2 \\ m_{x_3}^2 \\ \vdots \\ m_{x_N}^2 \end{bmatrix} = \begin{bmatrix} 1 & 2m_{x_1} & 2m_{y_1} & -m_{y_1}^2 \\ 1 & 2m_{x_2} & 2m_{y_2} & -m_{y_2}^2 \\ 1 & 2m_{x_3} & 2m_{y_3} & -m_{y_3}^2 \\ \vdots & \vdots & \vdots & \vdots \\ 1 & 2m_{x_N} & 2m_{y_N} & -m_{y_N}^2 \end{bmatrix} \begin{bmatrix} b^2 A_0^2 \frac{(1-\Delta_{A2})^2}{(1-\Delta_A)^2} - (k_x^2 + k_y^2 \gamma^2) \\ k_x \\ k_y \gamma^2 \\ \gamma^2 \end{bmatrix} \quad (37)$$

In some implementations, step 708 of the process 700A may be performed by solving equation 37 to obtain the values of the (i) the offset adjustment vector k, and (ii) the sensitivity mismatch coefficient γ. As noted above, each of the sampled values m in equation 37 is the same or similar to the sampled values m of signals 202A-B that are discussed above with respect to FIG. 3E. Each of the sampled values m may be obtained by sampling the signals 203A-B. Equation 37 can be solved by a least-squares fitting to obtain the vector k and sensitivity mismatch coefficient γ. As indicated above by equation 24, the vector k may be used to derive the offset vector o. As can be appreciated, the matrix immediately following the equality sign in equation 37 is another example of the matrix M (shown in FIG. 3F). In some respects, $b^2 A_0$ may be equal to the square norm of the magnetic field multiplied by the gain of the amplifier 204A-B.

Equation 37 can be re-written as follows:

$$A_0 \sqrt{1-\Delta_A^2} b_i = \Gamma(m_i = k) \tag{38}$$

where $$\Gamma = \begin{bmatrix} 1/\sqrt{\gamma} & 0 \\ 0 & \sqrt{\gamma} \end{bmatrix} \tag{39}$$

Setting $\Delta_A = 0$ would result in γ=1, and it would effectively reduce Model 2 to Model 1.

MODEL 3

Model 3 is a more generalized version of Model 2. Model 3 can be used to calculate the offset adjustment vector k, the sensitivity mismatch coefficient γ, and a non-orthogonality coefficient s. The non-orthogonality coefficient s is used to adjust the signals 103A and/or 103B to compensate for non-orthogonality between the axes of maximum sensitivity of sensing elements 202A-B.

The offset adjustment vector k includes elements $k_x$ and $k_y$. Element $k_x$ is based on element $o_x$ of an offset adjustment vector o, which can be used to adjust the offset of signal 203A. Element $k_y$ is based on element $o_y$ of an offset adjustment vector o, which can be used to adjust the offset of signal 203B. The offset adjustment vector o is related to the offset adjustment vector k by equation 4 below. As used throughout the disclosure, the term offset adjustment vector may refer to either one offset adjustment vector o or the offset adjustment vector k.

Model 3 is presented in the context of a target magnetic field at sample time i: $b_i = [b_{x_i} b_{y_i}]^T$. The magnitude of the magnetic field b is $b^2 = \|b_i\|^2$. The target magnetic field $b_i$ is the true value of the magnetic field that is generated by the target 120. The target magnetic field $b_i$ is constant over time (e.g., when the target 120 is a permanent magnet, etc.). The output of the sensing elements 202A-B at time i is, $m_i = [m_{x_i} m_{y_i}]^T$, where $m_i$. Is the same or similar to any of the sampled values m discussed above with respect to FIG. 3F. Each value $m_i$ is also referred to as sensed magnetic field $m_i$. As is discussed further below, solving Model 3 based on a set of sampled values of signals 203A-B may yield the offset adjustment vector, the sensitivity mismatch coefficients, and the non-orthogonality coefficient. These coefficients can be used to derive (or better approximate) the value of the target magnetic field $b_i$ from the measured magnetic field $m_i$, in accordance with the relationships that are described below by equations 21-24.

Model 3 is based on the following terms:

Target magnetic field at sample time i: $b_i = [b_{x_i} b_{y_i}]^T$

Sensed field at sample time i: $m_i = [m_{x_i} m_{y_i}]^T$

Stray field: $f = [f_x f_y]^T$ (considered to be constant over time)

Offset: $o = [o_x o_y]^T$ (considered to be constant over time)

Non-orthogonality matrix:

$$R = \begin{bmatrix} 1 & 0 \\ -\sin(\theta) & \cos(\theta) \end{bmatrix}$$

(considered to be constant over time)
Sensitivity matrix:

$$S = S_o \begin{bmatrix} 1+\Delta_s & 0 \\ 0 & 1-\Delta_s \end{bmatrix}$$

(considered to be constant over time)
Electrical gain matrix:

$$G = G_o \begin{bmatrix} 1+\Delta_G & 0 \\ 0 & 1-\Delta_G \end{bmatrix}$$

(considered to be constant over time)

The sensed field m may be modeled by Equation 40 below:

$$m_i = G(SR(b_1 + f) + o) \tag{40}$$

Let:

$$m_i = Ab_i + k \tag{41}$$

where $$A = GSR = \tag{42}$$

$$A_0 \begin{bmatrix} 1+\Delta_A & 0 \\ 0 & 1-\Delta_A \end{bmatrix} \begin{bmatrix} 1 & 0 \\ -\sin(\theta) & \cos(\theta) \end{bmatrix} = A_0 \begin{bmatrix} (1+\Delta_A) & 0 \\ -(1-\Delta_A)s & (1-\Delta_A)c \end{bmatrix},$$

$$s = \sin(\theta) \text{, then it is constant over time} \tag{43}$$

$$c = \cos(\theta) \text{, then it is constant over time} \tag{44}$$

$$A_0 = G_0 S_0 (1+\Delta_G \Delta_S) \text{, then it is constant over time} \tag{45}$$

$$\Delta_A = \frac{\Delta_G + \Delta_s}{1+\Delta_G \Delta_s},$$

then it is constant over time \hfill (46)

$$k = GSRf + Go = \begin{bmatrix} k_x \\ k_y \end{bmatrix},$$

then it is constant over time \hfill (47)

$$A^{-1} = \frac{1}{A_0(1-\Delta_A^2)c}\begin{bmatrix}(1-\Delta_A)c & 0 \\ (1-\Delta_A)s & (1+\Delta_A)\end{bmatrix} \quad (48)$$

$$(A^{-1})^T = \frac{1}{A_0(1-\Delta_A^2)c}\begin{bmatrix}(1-\Delta_A)c & (1-\Delta_A)s \\ 0 & (1+\Delta_A)\end{bmatrix} \quad (49)$$

$$(A^{-1})^T A^{-1} = \frac{1}{A_0^2(1-\Delta_A^2)^2 c^2}\begin{bmatrix}(1-\Delta_A)^2 & (1-\Delta_A^2)s \\ (1-\Delta_A^2)s & (1+\Delta_A)^2\end{bmatrix} \quad (50)$$

$$b_i = A^{-1}(m_i - k) \quad (51)$$

$$b^2 = \|b_i\| = b_i^T b_i = (m_i-k)^T (A^{-1})^T A^{-1}(m_i - k)$$

$$= \begin{bmatrix}m_{x_i}-k_x & m_{y_i}-k_y\end{bmatrix}\frac{1}{A_0^2(1-\Delta_A^2)^2 c^2}\begin{bmatrix}(1-\Delta_A)^2 & (1-\Delta_A^2)s \\ (1-\Delta_A^2)s & (1-\Delta_A^2)^2\end{bmatrix}\begin{bmatrix}m_{x_i}-k_x \\ m_{y_i}-k_y\end{bmatrix}$$

$$= \frac{1}{A_0^2(1-\Delta_A^2)^2 c^2}\big[(m_{x_i}-k_x)(1-\Delta_A)^2 + (m_{y_i}-k_y)(1-\Delta_A^2)s(m_{x_i}-k_x)(1-\Delta_A^2)s +$$

$$(m_{y_i}-k_y)(1+\Delta_A)^2\big]\begin{bmatrix}m_{x_i}-k_x \\ m_{y_i}-k_y\end{bmatrix}$$

$$= \frac{1}{A_0^2(1-\Delta_A^2)^2 c^2}\big[(m_{x_i}-k_x)^2(1-\Delta_A)^2 +$$

$$2(m_{x_i}-k_x)(m_{y_i}-k_y)(1-\Delta_A^2)s + (m_{y_i}-k_y)^2(1+\Delta_A)^2\big]$$

$$= \frac{1}{A_0^2(1-\Delta_A^2)^2 c^2}\begin{bmatrix}m_{x_i}^2(1-\Delta_A)^2 + k_x^2(1-\Delta_A)^2 - 2m_{x_i}k_x(1-\Delta_A)^2 \\ 2m_{x_i}m_{y_i}(1-\Delta_A^2)s - 2m_{x_i}k_y(1-\Delta_A^2)s - \\ 2k_x m_{y_i}(1-\Delta_A^2)s + 2k_x k_y(1-\Delta_A^2)s \\ m_{y_i}^2(1+\Delta_A)^2 + k_y^2(1+\Delta_A)^2 - 2m_{y_i}k_y(1+\Delta_A)^2\end{bmatrix}$$

(53)

$$b^2 A_0^2(1-\Delta_A^2)^2 c^2 =$$

$$m_{x_i}^2(1-\Delta_A)^2 + k_x^2(1-\Delta_A)^2 - 2m_{x_i}k_x(1-\Delta_A)^2$$
$$2m_{x_i}m_{y_i}(1-\Delta_A^2)s - 2m_{x_i}k_y(1-\Delta_A^2)s - 2k_x m_{y_i}(1-\Delta_A^2)s + 2k_x k_y(1-\Delta_A^2)s$$
$$m_{y_i}^2(1+\Delta_A)^2 + k_y^2(1+\Delta_A)^2 - 2m_{y_i}k_y(1+\Delta_A)^2$$

$$b^2 A_0^2(1-\Delta_A^2)^2 c^2 = m_{x_i}^2(1-\Delta_A)^2 + m_{y_i}^2(1+\Delta_A)^2 + k_x^2(1-\Delta_A)^2 + k_y^2(1+\Delta_A)^2 \quad (54)$$

$$+ 2k_x k_y(1-\Delta_A^2)s - 2m_{x_i}\big[k_x(1-\Delta_A)^2 + k_y(1-\Delta_A^2)s\big]$$

$$-2m_{y_i}\big[k_x(1-\Delta_A^2)s + k_y(1+\Delta_A)^2\big] + 2m_{x_i}m_{y_i}(1-\Delta_A^2)s$$

$$b^2 A_0^2 \frac{(1-\Delta_A^2)^2}{(1-\Delta_A)^2} c^2 = m_{x_i}^2 + m_{y_i}^2\frac{(1+\Delta_A)^2}{(1-\Delta_A)^2} + k_x^2 + k_y^2 \frac{(1+\Delta_A)^2}{(1-\Delta_A)^2} + 2k_x k_y \frac{(1-\Delta_A^2)}{(1-\Delta_A)^2}s \quad (55)$$

$$-2m_{x_i}\left[k_x + k_y \frac{(1-\Delta_A^2)}{(1-\Delta_A)^2}s\right] - 2m_{y_i}\left[k_x \frac{(1-\Delta_A^2)}{(1-\Delta_A)^2}s + k_y\frac{(1+\Delta_A)^2}{(1-\Delta_A)^2}\right]$$

$$+ 2m_{x_i}m_{y_i}\frac{(1-\Delta_A^2)}{(1-\Delta_A)^2}s$$

$$\gamma = \frac{1+\Delta_A}{1-\Delta_A} \quad (56)$$

$$b^2 A_0^2 \frac{(1-\Delta_A^2)^2}{(1-\Delta_A)^2} c^2 = \quad (57)$$

$$m_{x_i}^2 + m_{y_i}^2 \gamma^2 + k_x^2 + k_y^2 \gamma^2 + 2k_x k_y \gamma s - 2m_{x_i}(k_x + k_y \gamma s) - 2m_{y_i}\big[k_x \gamma s + k_y \gamma^2\big] + 2m_{x_i}m_{y_i}\gamma s$$

$$m_{x_i}^2 = b^2 A_0^2 \frac{(1-\Delta_A^2)^2}{(1-\Delta_A)^2} c^2 - (k_x^2 + k_y^2 \gamma^2) - \quad (58)$$

$$2k_x k_y \gamma s + 2m_{x_i}(k_x + k_y \gamma s) + 2m_{y_i}\big[k_x \gamma s + k_y \gamma^2\big] - m_{y_i}^2 \gamma^2 - 2m_{x_i}m_{y_i}\gamma s$$

$$m_{x_i}^2 = \begin{bmatrix}1 & 2m_{x_i} & 2m_{y_i} & -m_{y_i}^2 & -2m_{x_i}m_{y_i}\end{bmatrix}\begin{bmatrix}b^2 A_0^2 \frac{(1-\Delta_A^2)^2}{(1-\Delta_A)^2} c^2 - (k_x^2 + k_y^2 \gamma^2) - 2k_x k_y \gamma s \\ k_x + k_y \gamma s \\ k_x \gamma s + k_y \gamma^2 \\ \gamma^2 \\ \gamma s\end{bmatrix} \quad (59)$$

Using N samples m of signals 203A-B, equation 59 may be re-written as follows:

$$\begin{bmatrix} m_{x_1}^2 \\ m_{x_2}^2 \\ m_{x_3}^2 \\ \vdots \\ m_{x_N}^2 \end{bmatrix} = \begin{bmatrix} 1 & 2m_{x_1} & 2m_{y_1} & -m_{y_1}^2 & -2m_{x_1}m_{y_1} \\ 1 & 2m_{x_2} & 2m_{y_2} & -m_{y_2}^2 & -2m_{x_2}m_{y_2} \\ 1 & 2m_{x_3} & 2m_{y_3} & -m_{y_3}^2 & -2m_{x_3}m_{y_3} \\ \vdots & \vdots & \vdots & \vdots & \vdots \\ 1 & 2m_{x_N} & 2m_{y_N} & -m_{y_N}^2 & -2m_{x_N}m_{y_N} \end{bmatrix} \quad (60)$$

$$\begin{bmatrix} b^2 A_0^2 \frac{(1-\Delta_A^2)^2}{(1-\Delta_A)^2} c^2 - (k_x^2 + k_y^2\gamma^2) - 2k_x k_y \gamma s \\ k_x + k_y \gamma s \\ k_x \gamma s + k_y \gamma^2 \\ \gamma^2 \\ \gamma s \end{bmatrix}$$

In some implementations, step 708 of the process 700A may be performed by solving equation 60 to obtain the values of the (i) the offset adjustment vector k, (ii) the sensitivity mismatch coefficient γ, and (iii) the non-orthogonality coefficient s. As noted above, each of the sampled values m in equation 60 is the same or similar to the sampled values m of signals 202A-B that are discussed above with respect to FIG. 3E. Each of the sampled values m may be obtained by sampling the signals 203A-B. Equation 60 can be solved by a least-squares fitting to obtain the values of the vector k, and sensitivity mismatch coefficient γ. As indicated above by equation 24, the vector k may be used to derive the offset vector o. Furthermore, solving equation F may yield the non-orthogonality coefficient s=sin (θ) or c=cos (θ), where θ is orthogonality error of sensors 202A-B (i.e., the deviation from 90 degrees of the angle between the axes of maximum sensitivity of sensing elements 202A-B). As can be appreciated, the matrix immediately following the equality sign in equation 60 is another example of the matrix M (shown in FIG. 3F). In some respects, $b^2 A_0$ may be equal to the square norm of the magnetic field multiplied by the gain of the amplifier 204A-B.

Let:

$$v_x = k_x + k_y \gamma s \quad (61)$$

$$v_y = k_x \gamma s + k_y \gamma^2 \quad (62)$$

Then, from equations 61 and 62, it follows:

$$k_x = \frac{v_x \gamma - v_y s}{\gamma(1-s^2)} \quad (63)$$

$$k_y = \frac{v_y - v_x \gamma s}{\gamma^2(1-s^2)} \quad (64)$$

Then, from equations 63 and 64, it follows:

$$A_0 \cos(\theta) b_i = \Theta \Gamma (m_i - k) \quad (64)$$

Where:

$$\Gamma = \begin{bmatrix} 1/\sqrt{\gamma} & 0 \\ 0 & \sqrt{\gamma} \end{bmatrix} \quad (65)$$

$$\Theta = \begin{bmatrix} \cos(\theta) & 0 \\ \sin(\theta) & 1 \end{bmatrix} \quad (66)$$

In some respects, setting θ=0 would yield s=sin(theta)=0, and it would effectively reduce Model 3 to Model 2.

The concepts and ideas described herein may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high-level procedural or object-oriented programming language to work with the rest of the computer-based system. However, the programs may be implemented in assembly, machine language, or Hardware Description Language. The language may be a compiled or an interpreted language, and it may be deployed in any form, including as a stand-alone program or as a module, component, subroutine, or another unit suitable for use in a computing environment. A computer program may be deployed to be executed on one computer or multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, or volatile memory. The term unit (e.g., a addition unit, a multiplication unit, etc.), as used throughout the disclosure may refer to hardware (e.g., an electronic circuit) that is configured to perform a function (e.g., addition or multiplication, etc.), software that is executed by at least one processor, and configured to perform the function, or a combination of hardware and software.

According to the present disclosure, a magnetic field sensing element can include one or more magnetic field sensing elements, such as Hall effect elements, magnetoresistance elements, or magnetoresistors, and can include one or more such elements of the same or different types. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge.*. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

The invention claimed is:

1. A method for use in a sensor, the method comprising:
obtaining at least three sampled values m, each of the sampled values m including a respective first component that is obtained based on a first signal and a respective second component that is obtained based on a second signal, the first signal being generated by a first magnetic field sensing element of the sensor in response to a magnetic field that is associated with a rotating target and the second signal being generated by a second magnetic field sensing element of the sensor in response to the magnetic field that is associated with the rotating target, each of the at least three sampled values being associated with a different respective angular position of the rotating target;
generating a plurality of number arrays based on the at least three sampled values m, each of the number arrays corresponding to a different respective sampled value m, each of the number arrays being based on a scaled or non-scaled value of the first component of the array's corresponding sampled value m and a scaled or non-scaled value of the second component of the array's corresponding sampled value m;
solving a system of equations to yield at least one of (i) an offset adjustment vector k, (ii) a sensitivity mismatch coefficient $\gamma$, and (iii) a non-orthogonality coefficient s, the system of equations being arranged to model each of the sampled values m as a function of: the respective one of the plurality of number arrays that is generated based on the sampled value m, the magnetic field that is associated with the rotating target, and the at least one of (i) the offset adjustment vector k, (ii) the sensitivity mismatch coefficient $\gamma$, and (iii) the non-orthogonality coefficient s;
storing the at least one of (i) the offset adjustment vector k, (ii) the sensitivity mismatch coefficient $\gamma$, and (iii) the non-orthogonality coefficient s in a memory of the sensor;
adjusting, by a processing circuitry of the sensor, at least one of the first signal and the second signal based on at least one of (i) the offset adjustment vector k, (ii) the sensitivity mismatch coefficient $\gamma$, and (iii) the non-orthogonality coefficient s; and
using, by the processing circuitry of the sensor, the first signal and the second signal to detect an angular position of the rotating target.

2. The method of claim 1, wherein at least three sampled values are obtained, and the system of equations has the form:

$$\begin{bmatrix} m_{x_1}^2 \\ m_{x_2}^2 \\ m_{x_3}^2 \\ m_{x_4}^2 \end{bmatrix} = \begin{bmatrix} 1 & 2m_{x_1} & 2m_{y_1} & -m_{y_1}^2 \\ 1 & 2m_{x_2} & 2m_{y_2} & -m_{y_2}^2 \\ 1 & 2m_{x_3} & 2m_{y_3} & -m_{y_3}^2 \\ 1 & 2m_{x_4} & 2m_{y_4} & -m_{y_4}^2 \end{bmatrix} \begin{bmatrix} b^2 A_0^2 \dfrac{(1-\Delta_A^2)^2}{(1-\Delta_A)^2} - (k_x^2 + k_y^2\gamma^2) \\ k_x \\ k_x\gamma s \\ \gamma^2 \end{bmatrix}$$

where $m_{x_q}$ and $m_{y_q}$ are the respective first and second components of sample value $m_q$, $N > q \geq 1$, $A_0$ is a sensitivity and gain product, N is a positive integer, b is the magnetic field that is associated with the rotating target, $k_x$ is a first component of the offset adjustment vector k, and $k_y$ is a second component of the offset adjustment vector k.

3. The method of claim 1, wherein each of the plurality of number arrays represents a different row in a matrix M, the matrix M having the form:

$$M = \begin{bmatrix} 1 & 2m_{x_1} & 2m_{y_1} \\ 1 & 2m_{x_2} & 2m_{y_2} \\ 1 & 2m_{x_3} & 2m_{y_3} \\ \vdots & \vdots & \vdots \\ 1 & 2m_{x_N} & 2m_{y_N} \end{bmatrix}$$

where $m_{x_q}$ and $m_{y_q}$ are the respective first and second components of sample value $m_q$, $N > q \geq 1$, and N is a positive integer.

4. The method of claim 1, wherein the first magnetic field sensing element includes at least one of a Hall element, a giant magnetoresistor (GMR), or a tunnel magnetoresistor (TMR), and the second magnetic field sensing element includes at least one of a Hall element, a giant magnetoresistor (GMR), or a tunnel magnetoresistor (TMR).

5. The method of claim 1, wherein each of the sampled values m includes one of an individual sampled vector of the first and second signals or an average of a plurality of sampled vectors, each of the plurality of sampled vectors being associated with a same position of the rotating target.

6. The method of claim 1, wherein the system of equations has the form:

$$\begin{bmatrix} m_{x_1}^2 \\ m_{x_2}^2 \\ m_{x_3}^2 \\ \vdots \\ m_{x_N}^2 \end{bmatrix} = \begin{bmatrix} 1 & 2m_{x_1} & 2m_{y_1} & -m_{y_1}^2 & -2m_{x_1}m_{y_1} \\ 1 & 2m_{x_2} & 2m_{y_2} & -m_{y_2}^2 & -2m_{x_2}m_{y_2} \\ 1 & 2m_{x_3} & 2m_{y_3} & -m_{y_3}^2 & -2m_{x_3}m_{y_3} \\ \vdots & \vdots & \vdots & \vdots & \vdots \\ 1 & 2m_{x_N} & 2m_{y_N} & -m_{y_N}^2 & -2m_{x_N}m_{y_N} \end{bmatrix}$$

$$\begin{bmatrix} b^2 A_0^2 \dfrac{(1-\Delta_A^2)^2}{(1-\Delta_A)^2} c^2 - (k_x^2 + k_y^2\gamma^2) - 2k_x k_y \gamma s \\ k_x + k_y \gamma s \\ k_x \gamma s + k_y \gamma^2 \\ \gamma^2 \\ \gamma s \end{bmatrix}$$

where $m_{x_q}$ and $m_{y_q}$ are the respective first and second components of sample value $m_q$, $N > q \geq 1$, N is a positive integer, b is the magnetic field that is associated with the rotating target, k is the offset adjustment vector, $k_x$ is a first component of the offset adjustment vector k, and $k_y$ is a second component of the offset adjustment vector k.

7. The method of claim 1, wherein at least three sampled values are obtained, and the system of equations has the form:

$$\begin{bmatrix} \|m_1\|^2 \\ \|m_2\|^2 \\ \|m_3\|^2 \end{bmatrix} = \begin{bmatrix} 1 & 2m_{x_1} & 2m_{y_1} \\ 1 & 2m_{x_2} & 2m_{y_2} \\ 1 & 2m_{x_3} & 2m_{y_3} \end{bmatrix} \begin{bmatrix} A_0^2\|b\|^2 - \|k\|^2 + 2\sigma_n^2 \\ k_x \\ k_y \end{bmatrix}$$

where $m_{x_q}$ and $m_{y_q}$ are the respective first and second components of sample value $m_q$, N>q≥1, N is a positive integer, b is the magnetic field that is associated with the rotating target, k is the offset adjustment vector, $k_x$ is a first component of the offset adjustment vector k, $k_y$ is a second component of the offset adjustment vector k, and $\sigma_n$ is noise variance.

8. The method of claim 1, wherein at least three sampled values are obtained, and the system of equations has the form:

$$\begin{bmatrix} \|m_1\|^2 \\ \|m_2\|^2 \\ \|m_3\|^2 \end{bmatrix} = \begin{bmatrix} 1 & 2m_{x_1} & 2m_{y_1} \\ 1 & 2m_{x_2} & 2m_{y_2} \\ 1 & 2m_{x_3} & 2m_{y_3} \end{bmatrix} \begin{bmatrix} A_0^2\|b\|^2 - \|k\|^2 \\ k_x \\ k_y \end{bmatrix}$$

where $m_{x_q}$ and $m_{y_q}$ are the respective first and second components of sample value $m_q$, N>q≥1, N is a positive integer, b is the magnetic field that is associated with the rotating target, $k_x$ is a first component of the offset adjustment vector k, and $k_y$ is a second component of the offset adjustment vector k.

9. The method of claim 1, wherein:
at least four sampled values m are obtained,
the system of equations is further arranged to model each of the sampled values m as a function of the sensitivity mismatch coefficient and the non-orthogonality coefficient, and
solving the system of equations yields the sensitivity mismatch coefficient and the non-orthogonality coefficient.

10. The method of claim 9, wherein the system of equations has the form:

$$\begin{bmatrix} \|m_1\|^2 \\ \|m_2\|^2 \\ \|m_3\|^2 \\ \|m_4\|^2 \end{bmatrix} = \begin{bmatrix} 1 & 2m_{x_1} & 2m_{y_1} & -2m_{x_1}m_{y_1} \\ 1 & 2m_{x_2} & 2m_{y_2} & -2m_{x_2}m_{y_2} \\ 1 & 2m_{x_3} & 2m_{y_3} & -2m_{x_3}m_{y_3} \\ 1 & 2m_{x_4} & 2m_{y_4} & -2m_{x_4}m_{y_4} \end{bmatrix} \begin{bmatrix} b^2 A_0^2 c^2 - (k_x^2 + k_y^2) - 2k_x k_y s \\ k_x + k_y s \\ k_x s + k_y \\ s \end{bmatrix}$$

where $m_{x_q}$ and $m_{y_q}$ are the respective first and second components of sample value $m_q$, N>q≥1, N is a positive integer, b is the magnetic field that is associated with the rotating target, $k_x$ is a first component of the offset adjustment vector k, and $k_y$ is a second component of the offset adjustment vector k.

11. A sensor, comprising:
a first magnetic field sensing element, the first sensing element being arranged to generate a first signal in response to a magnetic field that is associated with a rotating target;
a second magnetic field sensing element, the second sensing element being arranged to generate a second signal in response to the magnetic field that is associated with the rotating target;
a memory; and
a processing circuitry operatively coupled to the memory, the first magnetic field sensing element and the second magnetic field sensing element, the processing circuitry being configured to:
obtain at least three sampled values m, each of the sampled values m including a respective first component that is obtained based on the first signal and a respective second component that is obtained based on the second signal, each of the at least three sample values being associated with a different angular position of the rotating target;
generate a plurality of number arrays based on the at least three sampled values m, each of the number arrays corresponding to a different respective sampled value m, each of the number arrays being based on a scaled or non-scaled value of the first component of the array's corresponding sampled value m and a scaled or non-scaled value of the second component of the array's corresponding sampled value m; and
solve a system of equations to yield an offset adjustment vector k and, the system of equations being arranged to model each of the sampled values m as a function of: the respective one of the plurality of number arrays that is generated based on the sampled value m, the magnetic field that is associated with the rotating target, and the offset adjustment vector k; and
store the offset adjustment vector k in the memory;
adjust at least one of the first signal and the second signal based on the offset adjustment vector; and
use the first signal and the second signal to detect an angular position of the rotating target.

12. The sensor of claim 11, wherein the first magnetic field sensing element includes at least one of a Hall element, a giant magnetoresistor (GMR), or a tunnel magnetoresistor (TMR), and the second magnetic field sensing element includes at least one of a Hall element, a giant magnetoresistor (GMR), or a tunnel magnetoresistor (TMR).

13. The sensor of claim 11, wherein each of the sampled values m includes one of an individual sampled vector of the first and second signals or an average of a plurality of sampled vectors, each of the plurality of sampled vectors being associated with a same position of the rotating target.

14. The sensor of claim 11, wherein:
the system of equations is further arranged to model each of the sampled values m as a function of a non-orthogonality coefficient that is associated with the first and second magnetic field sensing elements,
solving the system of equations further yields the non-orthogonality coefficient, and
the processing circuitry is further configured to store the non-orthogonality coefficient in the memory.

15. The sensor of claim 11, wherein:
at least four sampled values m are obtained,
the system of equations is further arranged to model each of the sampled values m as a function of a sensitivity mismatch coefficient that is associated with the first and second magnetic field sensing elements,
solving the system of equations further yields the sensitivity mismatch coefficient, and
the processing circuitry is further configured to store the sensitivity mismatch coefficient in the memory.

16. The sensor of claim 11, wherein:
at least five sampled values m are obtained,
the system of equations is further arranged to model each of the sampled values m as a function of a sensitivity mismatch coefficient and a non-orthogonality coefficient,
solving the system of equations further yields the sensitivity mismatch coefficient and the non-orthogonality coefficient, and
the processing circuitry is further configured store the sensitivity mismatch coefficient and the non-orthogonality coefficient in the memory.

17. A system, comprising:
a processing circuitry configured to:
obtain at least three sampled values m, each of the sampled values m including a respective first component that is obtained based on a first signal and a respective second component that is obtained based on a second signal, the first signal being generated by a first magnetic field sensing element in response to a magnetic field that is associated with a rotating target and the second signal being generated by a second magnetic field sensing element in response to the magnetic field that is associated with the rotating target, each of the at least three sampled values being associated with a different respective angular position of the rotating target;
generate a plurality of number arrays based on the at least three sampled values m, each of the number arrays corresponding to a different respective sampled value m, each of the number arrays being based on a scaled or non-scaled value of the first component of the array's corresponding sampled value m and a scaled or non-scaled value of the second component of the array's corresponding sampled value m;
solve a system of equations to yield at least one of (i) an offset adjustment vector k, (ii) a sensitivity mismatch coefficient γ, and (iii) a non-orthogonality coefficient s, the system of equations being arranged to model each of the sampled values m as a function of: the respective one of the plurality of number arrays that is generated based on the sampled value m, the magnetic field that is associated with the rotating target, and the at least one of (i) the offset adjustment vector k, (ii) the sensitivity mismatch coefficient γ, and (iii) the non-orthogonality coefficient s; and
store the at least one of (i) the offset adjustment vector k, (ii) the sensitivity mismatch coefficient γ, and (iii) the non-orthogonality coefficient s in a memory, and
adjust at least one of the first signal and the second signal based on at least one of the (i) the offset adjustment vector k, (ii) the sensitivity mismatch coefficient γ, and (iii) the non-orthogonality coefficient s; and
use the first signal and the second signal to detect an angular position of the rotating target.

18. The system of claim 17, wherein the system includes a calibration system and the memory includes a non-volatile memory of a sensor, the sensor including the first and second magnetic field sensing elements.

19. The system of claim 17, wherein the system includes a signal processing system that is configured to process signals output from a sensor, the sensor including the first and second magnetic field sensing elements.

20. A system comprising:
means for obtaining at least three sampled values m, each of the sampled values m including a respective first component that is obtained based on a first signal and a respective second component that is obtained based on a second signal, the first signal being generated by a first magnetic field sensing element in response to a magnetic field that is associated with a rotating target and the second signal being generated by a second magnetic field sensing element in response to the magnetic field that is associated with the rotating target, each of the at least three sampled values being associated with a different respective angular position of the rotating target;
means for generating a plurality of number arrays based on the at least three sampled values m, each of the number arrays corresponding to a different respective sampled value m, each of the number arrays being based on a scaled or non-scaled value of the first component of the array's corresponding sampled value m and a scaled or non-scaled value of the second component of the array's corresponding sampled value m;
means for solving a system of equations to yield at least one of (i) an offset adjustment vector k, (ii) a sensitivity mismatch coefficient γ, and (iii) a non-orthogonality coefficient s, the system of equations being arranged to model each of the sampled values m as a function of: the respective one of the plurality of number arrays that is generated based on the sampled value m, the magnetic field that is associated with the rotating target, and the at least one of (i) the offset adjustment vector k, (ii) the sensitivity mismatch coefficient γ, and (iii) the non-orthogonality coefficient s; and
means for storing the at least one of (i) the offset adjustment vector k, (ii) the sensitivity mismatch coefficient γ, and (iii) the non-orthogonality coefficient s in a memory for use in adjusting at least one of the first signal and the second signal; and
means for adjusting at least one of the first signal and the second signal based on at least one of (i) the offset adjustment vector k, (ii) the sensitivity mismatch coefficient γ, and (iii) the non-orthogonality coefficient s,
wherein the first signal and the second signal are used to detect an angular position of the rotating target.

21. A non-transitory computer readable medium storing one or more processor-executable instructions, which, when executed by a processing circuitry, cause the processing circuitry to execute a process comprising the operations of:
obtaining at least three sampled values m, each of the sampled values m including a respective first component that is obtained based on a first signal and a respective second component that is obtained based on a second signal, the first signal being generated by a first magnetic field sensing element in response to a magnetic field that is associated with a rotating target and the second signal being generated by a second magnetic field sensing element in response to the magnetic field that is associated with the rotating target, each of the at least three sampled values being associated with a different respective angular position of the rotating target;
generating a plurality of number arrays based on the at least three sampled values m, each of the number arrays corresponding to a different respective sampled value m, each of the number arrays being based on a scaled or non-scaled value of the first component of the array's corresponding sampled value m and a scaled or non-scaled value of the second component of the array's corresponding sampled value m;
solving a system of equations to yield at least one of (i) an offset adjustment vector k, (ii) a sensitivity mismatch coefficient γ, and (iii) a non-orthogonality coefficient s, the system of equations being arranged to model each of the sampled values m as a function of: the respective one of the plurality of number arrays that is generated based on the sampled value m, the magnetic field that is associated with the rotating target, and the at least one of (i) the offset adjustment vector k, (ii) the sensitivity mismatch coefficient γ, and (iii) the non-orthogonality coefficient s; and
storing the at least one of (i) the offset adjustment vector k, (ii) the sensitivity mismatch coefficient γ, and (iii) the non-orthogonality coefficient s in a memory for use in adjusting at least one of the first signal and the second signal;

adjusting at least one of the first signal and the second signal based on at least and of (i) the offset adjustment vector k, (ii) the sensitivity mismatch coefficient γ, and (iii) the non-orthogonality coefficient s; and using the first signal and the second signal to detect an angular position of the rotating target.

* * * * *

UNITED STATES PATENT AND TRADEMARK OFFICE
CERTIFICATE OF CORRECTION

PATENT NO. : 11,740,070 B1  
APPLICATION NO. : 17/588383  
DATED : August 29, 2023  
INVENTOR(S) : Ezequiel Rubinsztain et al.

Page 1 of 4

It is certified that error appears in the above-identified patent and that said Letters Patent is hereby corrected as shown below:

In the Specification

Column 1, Lines 6-7 delete "one or magnetic field sensors" and replace with --one or more magnetic field sensors--.

Column 1, Line 25 delete "by first" and replace with --by a first--.

Column 2, Line 58 delete "by first" and replace with --by a first--.

Column 3, Line 28 delete "by first" and replace with --by a first--.

Column 4, Line 42 delete "first" and replace with --a first--.

Column 4, Line 45 delete "an analog-" and replace with --and an analog- --.

Column 6, Line 9 delete ""sampled value"." and replace with --"sampled value."--.

Column 6, Line 25 delete "of of" and replace with --of--.

Column 6, Line 39 delete "sample values" and replace with --sampled values--.

Column 6, Line 44 delete "As noted above" and replace with --As noted above,--.

Column 6, Line 48 delete "sample values" and replace with --sampled values--.

Column 7, Line 2 delete "of a sensitivity" and replace with --a sensitivity--.

Column 7, Line 20 delete "orthogonality mismatch" and replace with --an orthogonality mismatch--.

Column 7, Line 21 delete "sensitivity" and replace with --a sensitivity--.

Signed and Sealed this  
Fifteenth Day of October, 2024

Katherine Kelly Vidal  
*Director of the United States Patent and Trademark Office*

Column 7, Line 34 delete "sample values" and replace with --sampled values--.

Column 8, Line 27 delete "sample value" and replace with --sampled value--.

Column 8, Line 32 delete "sample value" and replace with --sampled value--.

Column 8, Line 38 delete "sample value" and replace with --sampled value--.

Column 8, Line 56 delete "sample value" and replace with --sampled value--.

Column 8, Line 57 delete "circular (or oval shape)," and replace with --circular (or oval) shape,--.

Column 9, Lines 9-10 delete "the one or more" and replace with --one or more--.

Column 9, Line 12 delete "the one or more" and replace with --one or more--.

Column 9, Line 42 delete "At step 704" and replace with --At step 704,--.

Column 9, Line 51 delete "then number arrays" and replace with --the number arrays--.

Column 10, Line 41 delete "Model 1 models noise that".

Column 10, Line 22 delete "At step 716" and replace with --At step 716,--.

Column 10, Line 50 delete "either one of offset adjustment vector o" and replace with --either the offset adjustment vector o--.

Column 10, Line 58 delete "is," and replace with --is--.

Column 10, Line 59 delete ". Is" and replace with --is--.

Column 11, Line 2 delete "Considered to be constant over time);" and replace with --(considered to be constant over time)--.

Column 12, Line 51 delete "sample values" and replace with --sampled values--.

Column 12, Line 53 delete "average but" and replace with --average, but--.

Column 14, Line 7 delete "due to for example" and replace with --due to, for example,--.

Column 14, Line 18 delete "that that" and replace with --that--.

Column 14, Lines 19-20 delete "target but not necessarily a full turn is required" and replace with --target, but a full turn is not necessarily required, or--.

CERTIFICATE OF CORRECTION (continued)
U.S. Pat. No. 11,740,070 B1

Column 14, Line 38 delete "either one of offset adjustment vector o" and replace with --either the offset adjustment vector o--.

Column 14, Line 46 delete "is," and replace with --is--.

Column 14, Line 47 delete ". Is" and replace with --is--.

Column 14, Line 52 delete "vector, and" and replace --vector and--.

Column 17, Line 1 delete "of the (i)" and replace with --of (i)--.

Column 17, Line 48 delete "either one of offset adjustment vector o" and replace with --either the offset adjustment vector o--.

Column 17, Line 56 delete "is," and replace with --is--.

Column 17, Line 57 delete "Is" and replace with --is--.

Column 21, Line 22 delete "of the (i)" and replace with --of (i)--.

Column 21, Line 34 delete "is orthogonality error" and replace with --is an orthogonality error--.

Column 22, Lines 4-5 delete "product, (e.g.," and replace with --product (e.g.,--.

Column 22, Line 8 delete "data processing apparatus" and replace with --the data processing apparatus--.

Column 22, Line 33 delete "may include but is not limited to" and replace with --may include, but is not limited to,--.

Column 22, Line 35 delete "a addition" and replace with --an addition--.

Column 22, Line 36 delete "disclosure" and replace with --disclosure,--.

Column 22, Line 39 delete "processor, and" and replace with --processor and--.

Column 22, Line 51 delete "element such" and replace with --element, such--.

Column 22, Line 53 delete "for example, a spin valve," and replace with --such as a spin valve,--.

Column 22, Line 59 delete "bridge.*." and replace with --bridge.*--.

Column 22, Line 67 delete "structures and techniques" and replace with --structures, and techniques--.

CERTIFICATE OF CORRECTION (continued)
U.S. Pat. No. 11,740,070 B1

In the Claims

Column 26, Line 1 delete "sample" and replace with --sampled--.

Column 26, Line 9 delete "value m and" and replace with --value m, and--.

Column 26, Line 13 delete "vector k and," and replace with --vector k,--.